(12) United States Patent
San Martin Molina et al.

(10) Patent No.: US 10,348,275 B2
(45) Date of Patent: Jul. 9, 2019

(54) FREQUENCY-DIVIDER CIRCUITRY

(71) Applicant: Cirrus Logic International Semiconductor Ltd., Edinburgh (GB)

(72) Inventors: Dario San Martin Molina, Granada (ES); Gordon James Bates, Edinburgh (GB)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 16/039,760

(22) Filed: Jul. 19, 2018

(65) Prior Publication Data

US 2019/0036514 A1    Jan. 31, 2019

Related U.S. Application Data

(60) Provisional application No. 62/537,088, filed on Jul. 26, 2017.

(30) Foreign Application Priority Data

Sep. 29, 2017    (GB) .................................. 1715819.7

(51) Int. Cl.
| | |
|---|---|
| *H03K 23/00* | (2006.01) |
| *H03K 3/03* | (2006.01) |
| *H03K 23/66* | (2006.01) |
| *G06F 1/04* | (2006.01) |
| *H03L 7/197* | (2006.01) |
| *H03L 7/099* | (2006.01) |
| *H03K 23/54* | (2006.01) |

(52) U.S. Cl.
CPC ............ *H03K 3/0315* (2013.01); *G06F 1/04* (2013.01); *H03K 23/00* (2013.01); *H03K 23/54* (2013.01); *H03K 23/667* (2013.01); *H03L 7/0995* (2013.01); *H03L 7/1974* (2013.01)

(58) Field of Classification Search
CPC .... H03K 3/03315; H03K 23/667; G06F 1/04; H03L 7/0995; H03L 7/1974
USPC ......................................................... 327/117
See application file for complete search history.

(56) References Cited

U.S. PATENT DOCUMENTS 5,072,372 A    12/1991  Schmidt
5,661,428 A *  8/1997  Li ........................... G05F 3/242
                                                    323/313
(Continued)

OTHER PUBLICATIONS

Combined Search and Examination Report, UKIPO, Application No. GB1715819.7, dated Mar. 22, 2018.

*Primary Examiner* — Dinh T Le
(74) *Attorney, Agent, or Firm* — Jackson Walker L.L.P.

(57) ABSTRACT

There is disclosed configurable frequency-divider circuitry for generating a target signal of a frequency Fr/Di based on a reference signal of a frequency Fr, where Di is an integer divider ratio, the frequency-divider circuitry comprising: N divider stages organised into a ring, each stage configured to receive an input signal and generate an output signal, with the output signal of each successive stage in the ring being the input signal of the next stage in the ring, wherein: the ring of stages is controlled by the reference signal so that the output signals are governed by the reference signal; the target signal is one of the output signals or a signal derived therefrom; and at least one of the stages is a configurable stage, whose mode of operation is configurable based on a configuration signal to configure the value of Di.

14 Claims, 30 Drawing Sheets

(56) References Cited

U.S. PATENT DOCUMENTS

| | | | | |
|---|---|---|---|---|
| 8,344,765 B2* | 1/2013 | Qiao | ................ | H03K 23/40 |
| | | | | 327/115 |
| 8,519,742 B2* | 8/2013 | Zhang | .............. | H03K 3/356121 |
| | | | | 326/46 |
| 8,707,069 B2* | 4/2014 | Wen | ................ | G06F 1/181 |
| | | | | 174/50 |
| 2006/0087350 A1* | 4/2006 | Ruffieux | ................ | H03K 23/54 |
| | | | | 327/117 |
| 2010/0259307 A1 | 10/2010 | Kondou | | |
| 2012/0081156 A1 | 4/2012 | Hesen et al. | | |
| 2012/0252393 A1 | 10/2012 | Xie et al. | | |
| 2013/0234763 A1 | 9/2013 | Gomm | | |

* cited by examiner

| Mode/Configuration Signal ||  Mode |
|---|---|---|
| M1 | M2 | |
| 1 (OFF) | 1 (ON) | A |
| 1 (OFF) | 0 (OFF) | B |
| 0 (ON) | 0 (OFF) | C |
| 0 (ON) | 1 (ON) | I |

Figure 5

DIV-3
50/50

| STAGE | | | Operation |
|---|---|---|---|
| 1 | 2 | 3 | |
| A | A | B | DIV-1 |
| A | C | B | DIV-2 |
| B | B | B | DIV-3 |

Figure 14

| STAGE | | | | | Operation |
|---|---|---|---|---|---|
| 1 | 2 | 3 | 4 | 5 | |
| A | A | A | A | B | DIV-1 |
| A | A | A | C | B | DIV-2 |
| A | A | C | B | B | DIV-3 |
| A | C | B | B | B | DIV-4 |
| B | B | B | B | B | DIV-5 |

Figure 15

| Operation | 1 | 2 | 3 | 4 | 5 | ... | N-3 | N-2 | N-1 | N |
|---|---|---|---|---|---|---|---|---|---|---|
| DIV-1 | A | A | A | A | A | | A | A | A | B |
| DIV-2 | A | A | A | A | A | | A | A | C | B |
| DIV-3 | A | A | A | A | A | | A | C | B | B |
| DIV-4 | A | A | A | A | A | | C | B | B | B |
| ... | | | | | | | | | | |
| DIV-(N-3) | | | | | | | C | B | B | B |
| DIV-(N-2) | | | | | | | A | C | B | B |
| DIV-(N-1) | | | | | | | A | A | C | B |
| DIV-N | | | | | | | A | A | A | B |

Figure 16

FREQUENCY-DIVIDER CIRCUITRY

TECHNICAL FIELD

The present disclosure relates to frequency-divider circuitry, for example for generating a target output clock signal CLKout having a frequency Fout/Di that is based on a reference input clock signal CLKin having a frequency Fin, where Di is an integer divider ratio.

BACKGROUND INFORMATION

Such frequency-divider circuitry may be configured to switch between two different values of Di, such as Di1 and Di2. Alternatively, two sets of frequency-divider circuitry could be provided having such different values of Di, and their outputs could be switched between. By switching between Di1 and Di2, a fractional frequency divider may be provided where the target output clock signal CLKout stabilises at a frequency which is between Di1 and Di2 (i.e. at the time average of Di1 and Di2). The present disclosure will be understood accordingly.

Such frequency-divider circuitry may be referred to as a clock divider. Such circuitry finds wide use, to provide a target clock signal based on a reference clock signal (e.g. from an oscillator or other clock source) for any circuitry operable based on such a target clock signal. For example, most integrated circuits (ICs) use one or more clock signals to synchronise or otherwise control different parts of system circuitry. Circuits operating based on clock signals may thus be considered synchronous circuits. Examples include processing circuits such as audio-processing circuits.

Frequency-divider circuitry therefore may be implemented on ICs or systems within a host device, which may be considered an electrical or electronic device. Examples include a portable and/or battery powered host device such as a mobile telephone, an audio player, a video player, a PDA, a mobile computing platform such as a laptop computer or tablet and/or a games device.

Existing frequency-divider circuitry has been found to have shortcomings, in particular when more than one divider ratio Di may be needed (in a single IC or application, or across different ICs or applications). It is accordingly desirable to provide improved frequency-divider circuitry, for example where the reference clock signal CLKin and/or divider ratio Di can readily be configured.

SUMMARY OF EMBODIMENTS

According to a first aspect there is provided configurable frequency-divider circuitry for generating a target signal of a frequency Fr/Di based on a reference signal of a frequency Fr, where Di is an integer divider ratio, the frequency-divider circuitry comprising: N divider stages organised into a ring, each stage configured to receive an input signal and generate an output signal, with the output signal of each successive stage in the ring being the input signal of the next stage in the ring, wherein: the ring of stages is controlled by the reference signal so that the output signals are governed by the reference signal; the target signal is one of the output signals or a signal derived therefrom; and at least one of the stages is a configurable stage, whose mode of operation is configurable based on a configuration signal to configure the value of Di.

As such, it is possible to configure the divider ratio Di by configuring one or more of the stages of the ring. Thus, the same circuitry can be used to provide more than one divider ratio Di.

As will become apparent, with more of the stages being configurable stages, there is more flexibility as to how to configure the divider ratio Di and as to the divider ratios Di available. For example, a plurality or all of the stages may be configurable stages.

The target and reference signals may be clock signals (as examples of periodic signals), such as digital clock signals. The input and output signals may thus also be clock signals. The configurable frequency-divider circuitry may be considered configurable clock-divider circuitry.

The stages may have a similar circuitry structure to one another, or may even be identical to or the same as one another. Having the stages identical to one another is advantageous from a circuitry design perspective, for example reducing the burden associated with detailed circuitry layout. This may be particularly the case in relation to integrated circuitry implementations. For example, the frequency-divider circuitry may be, or be part of, an integrated circuit, such as an IC chip.

Each stage may comprise a plurality of transistors arranged to provide a pull-up sub-circuit and a pull-down sub-circuit. The transistors are preferably NMOS and PMOS transistors. Each transistor in each pull-up sub-circuit may be a PMOS transistor and each transistor in each pull-down sub-circuit may be an NMOS transistor.

Particular transistors may be controlled by the reference signal so that the output signals (as a group) are governed by, or controlled by, or synchronised with, or timed by the reference signal.

Each stage may be arranged to operate in at least one of a set of modes of operation, a combination of the modes in which the stages are operating determining the value of Di.

The set of modes may comprise two or more of: a mode A, where whether a voltage level of the output signal is pulled up to or held at logic high is dependent on both the input signal and the reference signal, and whether a voltage level of the output signal is pulled down to or held at logic low is dependent on the input signal and independent of the reference signal; a mode B, where whether a voltage level of the output signal is pulled up to or held at logic high, or pulled down to or held at logic low, is dependent on both the input signal and the reference signal; a mode C, where whether a voltage level of the output signal is pulled up to or held at logic high is dependent on the input signal and independent of the reference signal, and whether a voltage level of the output signal is pulled down to or held at logic low is dependent on both the input signal and the reference signal; and a mode I, where whether a voltage level of the output signal is pulled up to or held at logic high, or pulled down to or held at logic low, is dependent on the input signal and independent of the reference signal. The mode I may be considered an inverter mode.

Modes A to C and I could be described in Boolean notation. For example, where the input signal is expressed as IS and the reference signal is expressed as RS, and where pull up paths are implemented with PMOS transistors and pull down paths are implemented with NMOS transistors, in mode A, pull up=/IS./RS and pull down=IS, in mode B, pull up=/IS./RS and pull down=IS.RS, in mode C, pull up=/IS and pull down=IS.RS, and in mode I, pull up=/IS and pull down=IS.

The set of modes may comprise at least or only modes A and B. The set of modes may comprise at least or only modes A and C. The set of modes may comprise at least or only modes B and C. The set of modes may comprise at least or only modes A to C. The set of modes may comprise all of modes A, B, C and I.

Each stage arranged to operate in mode A may comprise: for any (every/each) pull-up path configured to become conductive during operation in that mode, at least a reference-signal-controlled transistor and an input-signal-controlled transistor connected in series along that path, that path configured to become conductive when both of those transistors are ON; and for at least one pull-down path configured to become conductive during operation in that mode, at least an input-signal-controlled transistor connected in series along that path without any reference-signal-controlled transistors connected in series along that path, that path configured to become conductive when that input-signal-controlled transistor is ON.

Each stage arranged to operate in mode B may comprise: for any (every/each) pull-up path configured to become conductive during operation in that mode, at least a reference-signal-controlled transistor and an input-signal-controlled transistor connected in series along that path, that path configured to become conductive when both of those transistors are ON; and for any (every/each) pull-down path configured to become conductive during operation in that mode, at least a reference-signal-controlled transistor and an input-signal-controlled transistor connected in series along that path, that path configured to become conductive when both of those transistors are ON.

Each stage arranged to operate in mode C may comprise: for at least one pull-up path configured to become conductive during operation in that mode, at least an input-signal-controlled transistor connected in series along that path without any reference-signal-controlled transistors connected in series along that path, that path configured to become conductive when that input-signal-controlled transistor is ON; and for any (every/each) pull-down path configured to become conductive during operation in that mode, at least a reference-signal-controlled transistor and an input-signal-controlled transistor connected in series along that path, that path configured to become conductive when both of those transistors are ON.

Each stage arranged to operate in mode I may comprise: for at least one pull-up path configured to become conductive during operation in that mode, at least an input-signal-controlled transistor connected in series along that path without any reference-signal-controlled transistors connected in series along that path, that path configured to become conductive when that input-signal-controlled transistor is ON; and for at least one pull-down path configured to become conductive during operation in that mode, at least an input-signal-controlled transistor connected in series along that path without any reference-signal-controlled transistors connected in series along that path, that path configured to become conductive when that input-signal-controlled transistor is ON.

Each configurable stage may be configurable to operate in a plurality or all of the modes of the set of modes. Each configurable stage may be configurable to operate in at least or only modes A and B. Each configurable stage may be configurable to operate in at least or only modes A and C. Each configurable stage may be configurable to operate in at least or only modes B and C. Each configurable stage may be configurable to operate in at least or only modes A to C. Each configurable stage may be configurable to operate in any of modes A, B, C and I.

Each configurable stage may comprise one or more configuration transistors, operable (e.g. based on a configuration signal, such as mode configuration signal) to control the mode of operation of that stage.

Each configurable stage may comprise, in addition to other pull-up and pull-down paths, one or both of: a configuring pull-up path, with a first configuration transistor and an input-signal-controlled transistor connected in series along that path, that path configured to become conductive when both of those transistors are ON so as to override any other pull-up path whose conductivity is dependent on the reference signal; and a configuring pull-down path, with a second configuration transistor and an input-signal-controlled transistor connected in series along that path, that path configured to become conductive when both of those transistors are ON so as to override any other pull-down path whose conductivity is dependent on the reference signal.

Each configuring pull-up path may be configured to remain non-conductive when its first configuration transistor is OFF, to allow another pull-up path to control pull-up conductivity of the stage concerned. Each configuring pull-down path may be configured to remain non-conductive when its second configuration transistor is OFF, to allow another pull-down path to control pull-down conductivity of the stage concerned.

The configurable frequency-divider circuitry may comprise a configuration unit operable, for each configurable stage having both configuring pull-up and pull-down paths, to provide its configuration signal so as: for mode A, to turn the first and second configuration transistors OFF and ON respectively; for mode B, to turn the first and second configuration transistors OFF and OFF respectively; for mode C, to turn the first and second configuration transistors ON and OFF respectively; and for mode I, to turn the first and second configuration transistors ON and ON respectively.

Each stage arranged to operate in mode A may comprise (e.g. only): a CMOS inverter arrangement of NMOS and PMOS transistors with an additional PMOS transistor connected in series between the PMOS transistor of the CMOS inverter arrangement and a logic high voltage reference, with the NMOS and PMOS transistors of the CMOS inverter arrangement controlled by the input signal and the additional PMOS transistor controlled by the reference signal, and with the output of the CMOS inverter arrangement providing the output signal. Such a stage may be considered non-configurable.

Each stage arranged to operate in mode B may comprise (e.g. only): a CMOS inverter arrangement of NMOS and PMOS transistors with an additional PMOS transistor connected in series between the PMOS transistor of the CMOS inverter arrangement and a logic high voltage reference and an additional NMOS transistor connected in series between the NMOS transistor of the CMOS inverter arrangement and a logic low voltage reference, with the NMOS and PMOS transistors of the CMOS inverter arrangement controlled by the input signal and the additional NMOS and PMOS transistors controlled by the reference signal, and with the output of the CMOS inverter arrangement providing the output signal. Such a stage may also be considered non-configurable.

Each stage arranged to operate in mode C may comprise (e.g. only): a CMOS inverter arrangement of NMOS and PMOS transistors with an additional NMOS transistor connected in series between the NMOS transistor of the CMOS inverter arrangement and a logic low voltage reference, with the NMOS and PMOS transistors of the CMOS inverter arrangement controlled by the input signal and the additional NMOS transistor controlled by the reference signal, and with the output of the CMOS inverter arrangement providing the output signal. Such a stage may also be considered non-configurable.

Each stage arranged to operate in mode I may comprise (e.g. only): a CMOS inverter arrangement of NMOS and PMOS transistors controlled by the input signal, with the output of the CMOS inverter arrangement providing the output signal. Such a stage may also be considered non-configurable.

The configurable frequency-divider circuitry may comprise a selector operable to receive the output signals, optionally via a buffer (such as an inverting buffer—e.g. a CMOS inverter—or a non-inverting buffer—e.g. two CMOS inverters in series), from some or all of stages, and to output one or more of the output signals or buffered output signals as the target signal in dependence upon a selection signal. Thus, the configurable frequency-divider circuitry may be highly flexible in the target signal which can be produced.

The configurable frequency-divider circuitry may comprise a control unit operable to vary the configuration signal to change the value of Di and/or the selection signal to change which one or more of the output signals or buffered output signals is output as the target signal, thereby providing duty cycle control. Similarly, the configurable frequency-divider circuitry may comprise a control unit operable to vary the configuration signal over time so that the value of Di changes over time and when averaged over time has a fractional component. Such types of control may be used in combination. For example, by controlling duty cycle it may be possible to control the average voltage level of one or more of the output signals (such as the target signal), effectively providing DAC (digital-to-analogue converter) functionality.

The number of stages N may be an odd number greater than or equal to 3. There may be 3, 5, 7, 9, 11, 13, 15 etc. stages. In a given combination of modes, Di may be an integer. For each combination of modes, Di may be an integer.

Each stage may be configured to generate its output signal at an output node of that stage. Further, at least one stage, or each stage, or each of a plurality of the stages may comprise a buffer, such as an inverting buffer, connected to the output node of that stage so as to buffer the output signal and provide the buffered output signal as the target signal. The or each buffer may be an enablable buffer, configured to be enabled or disabled in dependence upon an associated enable signal.

The reference and target signals may be clock signals as already mentioned, and may be voltage signals. The reference and target signals may be digital or switched logic-level signals.

According to a second aspect there is provided an electrical or electronic device, comprising: configurable frequency-divider circuitry according to the first aspect; and target-signal-controlled circuitry configured to receive the target signal generated by the configurable frequency-divider circuitry and to operate based upon that target signal.

According to a third aspect there is provided a digital-to-analogue converter, comprising configurable frequency-divider circuitry according to the first aspect.

According to a fourth aspect there is provided configurable frequency-divider circuitry for generating a target signal of a frequency Fr/Di based on a reference signal of a frequency Fr, the frequency-divider circuitry comprising: N divider stages, each stage configured to receive an input signal at an input node and generate an output signal at an output node, the target signal being one of the output signals or a signal derived therefrom, wherein: the stages are organised into a ring, with the output signal of each successive stage in the ring being the input signal of the next stage in the ring; each stage comprises a plurality of transistors arranged to provide a pull-up sub-circuit and a pull-down sub-circuit; each stage is arranged to operate in at least one of a predetermined set of modes of operation, with particular said transistors controlled by the reference signal so that the output signals are governed by the reference signal, a combination of the modes in which the stages are operating determining the value of Di; and at least one of said stages is a configurable stage, whose mode of operation is configurable based on a configuration signal to thereby configure the value of Di.

According to a fifth aspect there is provided frequency-divider circuitry for generating a target signal of a frequency Fr/Di based on a reference signal of a frequency Fr, the frequency-divider circuitry comprising: N divider stages organised into a ring, each stage configured to receive an input signal and generate an output signal, with the output signal of each successive stage in the ring being the input signal of the next stage in the ring, wherein: the ring of stages is controlled by the reference signal so that the output signals are governed by the reference signal; the target signal is one of the output signals or a signal derived therefrom; each stage is arranged to operate in at least one of a set of modes of operation, a combination of the modes in which the stages are operating determining the value of Di; and N is 3 or more, or 5 or more, or 7 or more. Such circuitry may be configurable or non-configurable.

According to a sixth aspect there is provided frequency-divider circuitry, comprising a plurality of modified CMOS inverter stages connected together in a ring arrangement, wherein: each stage is a modified CMOS inverter stage in that, in addition to the NMOS and PMOS transistors of the CMOS inverter, it comprises either a PMOS transistor between the PMOS transistor of the CMOS inverter and logic high, or an NMOS transistor between the NMOS transistor of the CMOS inverter and logic low, or both; the additional transistors are controlled by an input reference signal; and at least one of the stages outputs a target signal, the target signal being frequency-divided by a divider ratio Di compared to the reference signal. Such circuitry may be configurable or non-configurable.

According to a seventh aspect there is provided configurable ring oscillator circuitry for generating at least one output clock signal at a frequency Fr/Di that is based on a reference input clock signal of a frequency Fr, where Di is an integer divider ratio, the oscillator circuitry comprising: N divider stages, each stage configured to receive an input signal and generate an output signal, with the output signal of each successive stage in the ring being the input signal of the next stage in the ring, wherein: each of the stages is controlled by the reference input clock signal so that the output signals are governed by the reference signal; and the at least one output clock signal is one of the output signals of a stage or a signal derived therefrom; and at least one of the stages is a configurable stage, whose mode of operation is configurable based on a configuration signal to configure the value of Di.

According to an eighth aspect there is provided configurable frequency-divider circuitry for generating a target frequency Fr/Di based on a reference frequency Fr, where Di is an integer divider ratio, the frequency-divider circuitry comprising an N-stage ring oscillator wherein at least one of the N stages is mode-configurable so as to determine the value of Di.

Method aspects corresponding to the apparatus (circuitry) aspects are envisaged. Features of the apparatus aspects may thus have corresponding features in the method aspects. Computer program aspects are envisaged, for example for generating the configuration, select and enable signals discussed later herein, and the present disclosure will be understood accordingly.

BRIEF DESCRIPTION OF THE DRAWINGS

Reference will now be made, by way of example, to the accompanying drawings, of which:

FIG. 2b is another schematic diagram of the generic stage FIG. 2a;

FIG. 3b is another schematic diagram of the configurable stage of FIG. 3a;

FIG. 5 is a table useful for understanding possible modes of operation for stages of the divider circuitry of FIG. 1;

FIG. 14 is a table indicating combinations of modes where N is 3;

FIG. 15 is a table indicating combinations of modes where N is 5;

FIG. 16 is a table extending the teaching of FIGS. 14 and 15;

DETAILED DESCRIPTION

Embodiments relate to frequency-divider circuitry and devices/apparatus comprising such circuitry. As will be apparent, such circuitry may find particular use as a clock divider. Particular embodiments are configurable, as will become apparent.

Such frequency-divider circuitry is advantageous, particularly in its flexibility to provide a range of divider ratios Di, and the ability to configure the divider ratio Di, without increased complexity. Such frequency-divider circuitry is also considered advantageous in terms of its size and cost (IC chip area) as well as its relatively-low power consumption.

Figure 1:
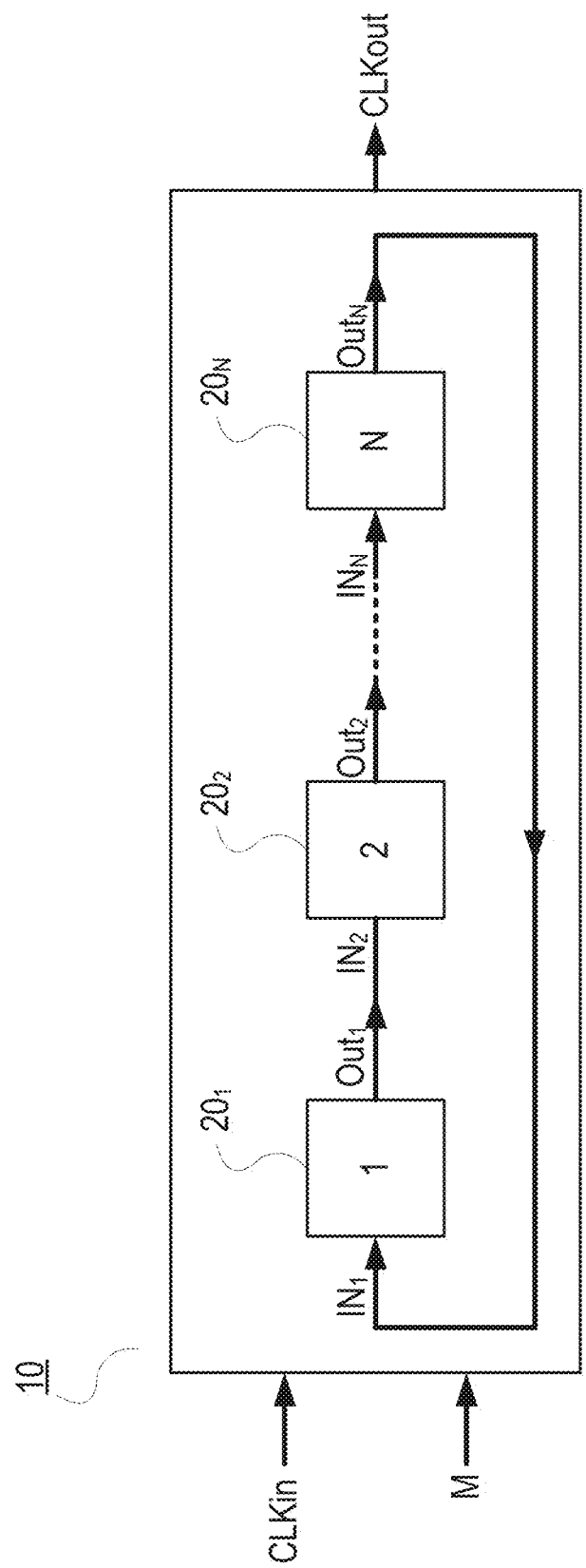
FIG. 1 is a schematic diagram of frequency-divider circuitry, comprising a plurality of divider stages.

FIG. 1 is a schematic diagram of frequency-divider circuitry 10. For simplicity, frequency-divider circuitry will hereinafter be referred to simply as divider circuitry.

Divider circuitry 10 is configured to generate an output clock CLKout (target signal) based on an input clock CLKin (reference signal), where the input clock CLKin has a frequency Fin and the output clock has a frequency Fout. In particular, divider circuitry 10 is configured to generate CLKout where Fout is equal to Fin/Di, where Di is an integer divider ratio. It will be understood that such signals are digital signals, and indeed the signals discussed herein will generally be considered to be digital voltage signals (the circuitry being voltage-mode circuitry). In some arrangements the frequency Fin may be variable, whereas in other arrangements it may be constant.

In certain arrangements, reference signal CLKin and target signal CLKout are digital clock signals (e.g., switched logic-level) signals. As such, divider circuitry 10 may be considered clock divider circuitry in such arrangements. The following disclosure will be understood accordingly.

Divider circuitry 10 comprises N divider stages 20, wherein N is always an odd integer, organised into a ring as indicated in FIG. 1. In particular, each stage 20 is configured to receive a respective input signal IN and generate a respective output signal OUT, with the output signal OUT of each successive stage 20 in the ring being the input signal IN of the next stage in the ring.

As indicated in FIG. 1, the divider circuitry 10 is configured to receive the input clock CLKin (as mentioned above). As will become more apparent later, the input clock CLKin controls, at least in part, the switching of the N-stage ring of stages $20_1$-$20_N$ so that the respective output signals $Out_1$-$Out_N$ of each of the stages $20_1$-$20_N$ are clocked or controlled or governed or influenced by (for example synchronised with) the input clock CLKin. Also as will become more apparent later, one or more of the output signals $Out_1$-$Out_N$ (or equally the input signals $IN_1$-$IN_N$) may be suitable to be the output clock CLKout. Of course, the output clock CLKout may be derived from one of the output signals $Out_1$-$Out_N$.

Each stage $20_1$-$20_N$ may be configured or arranged to operate in at least one of a set of modes of operation. Examples of such modes A, B, C and I are described in more detail below. It will become apparent (once the four modes are considered in more detail) that a combination of the modes in which each of the stages $20_1$-$20_N$ are operating determines the value of the divider ratio Di. For example, by configuring one of the stages to operate in mode C rather than mode A, a combination AAB may be changed to ACB, with a consequential change in divider ratio Di.

For now, it will simply be understood that a stage 20 operating in one mode will act differently from a stage operating in a different mode and hence a difference in mode will contribute to a difference in a stage's input and output signals IN and OUT (and hence a difference in the output clock frequency Fout and hence the divider ratio Di). As concrete examples, given 3 stages (i.e., N=3), the combination AAB happens to give the divider ratio 1 (i.e., Di=1), referred to as a DIV-1 or a divide-by-one operation, whereas the combination BBB happens to give the divider ratio 3 (i.e., Di=3), referred to as a DIV-3 or a divide-by-three operation. Here, AAB will be understood to correspond to three stages $20_1$-$20_3$ connected together in a ring as in FIG. 1, i.e. with N=3, with those stages $20_1$-$20_3$ configured to operate in modes A, A and B, respectively, in that order. Similarly, BBB will be understood to correspond to three stages $20_1$-$20_3$ connected together in a ring as in FIG. 1, with those stages configured to operate each in mode B.

Other possible mode combinations are of course possible, and several are explored later herein by way of example, however the principle is that the particular mode combination affects the value of the divider ratio Di.

As also indicated in FIG. 1, the divider circuitry 10 is configured to receive a mode configuration signal M. At least one of the stages 20 is a configurable stage, whose mode of operation is configurable based on the mode configuration signal M to configure the value of the divider ratio Di. That is, as will be apparent from the discussion above, by changing the mode of operation of such a configurable stage it is possible to change the value of the divider ratio Di. Continuing the running example of N=3, and with two (i.e., N−1) of the stages 20 being configurable stages, a combination AAB could for example be changed to BBB, with a consequential change in divider ratio Di from 1 to 3.

Incidentally, looking back to FIG. 1, it will be appreciated that the combination ACB is equivalent to BAC and also to CBA, because the apparent changes simply correspond to rotating the ring of stages $20_1$-$20_3$ around. Thus, all three of these equivalent combinations give a divider ratio Di of 2. The present disclosure will be understood accordingly.

Figure 2A:
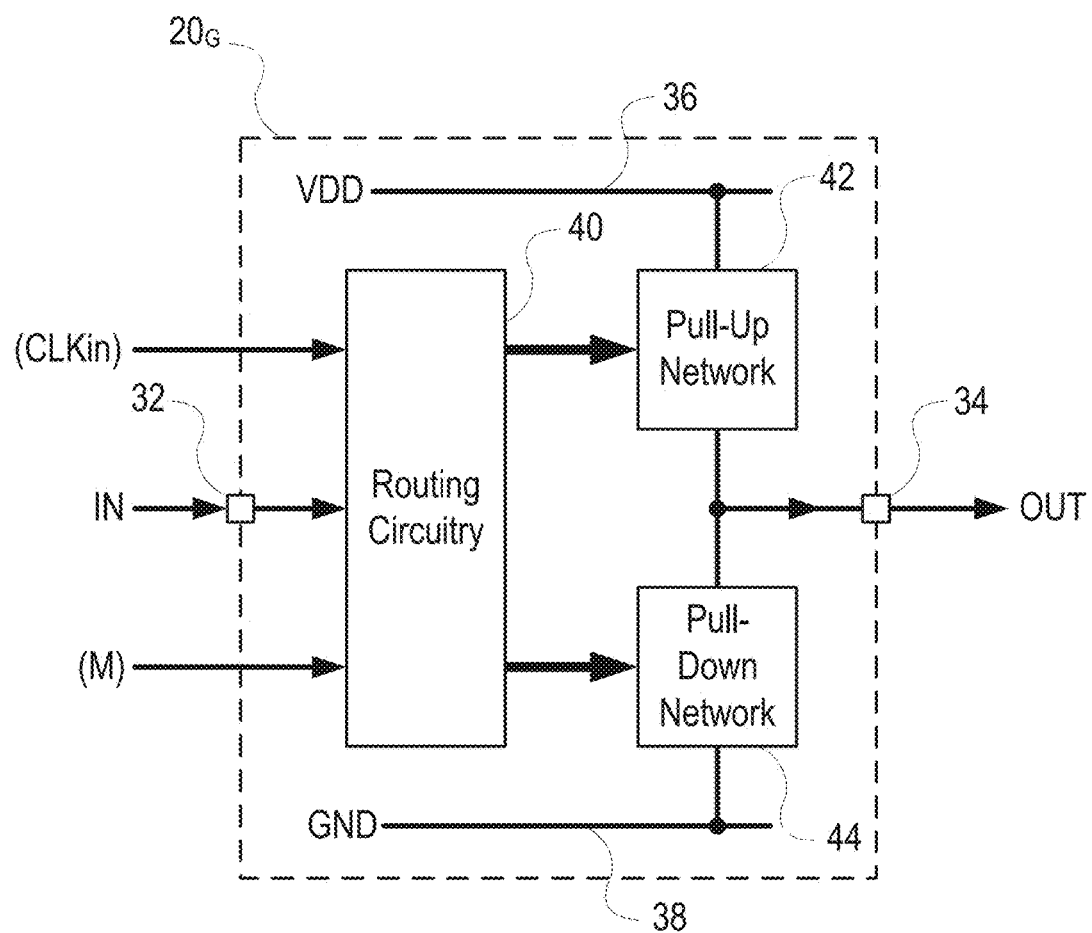
FIG. 2a is a schematic diagram of an example generic stage for use in the divider circuitry of FIG. 1.

FIG. 2a is a schematic diagram of an example generic stage 20, here denoted $20_G$, so as to enable an understanding of commonalities in design/configuration between different stages $20_1$-$20_N$ despite them operating potentially in different modes. It is to be understood that stage $20_G$ is intended to represent both configurable stages and also non-configurable stages. Hence, there are instances (when the stage is non-configurable) where various signals are not needed and thus they are shown here as optional (with brackets).

Stage $20_G$ comprises an input node, or terminal, 32, an output node, or terminal, 34, a logic high voltage reference voltage 36, a logic low voltage reference voltage 38, routing circuitry 40, a pull-up network 42 and a pull-down network 44. The logic high voltage reference 36 may be considered a voltage supply and may for example be a VDD supply as indicated. The logic low voltage reference 38 may similarly be considered a voltage supply and may for example be a ground supply GND as indicated. Therefore, VDD and GND represent the power supply rails wherein VDD>GND in terms of voltage level.

For simplicity, the high-side supply voltage 36 will be referred to simply as logic high (as will its voltage level) and the low-side supply voltage 38 will be referred to simply as logic low (as will its voltage level). Further, wherever possible, like elements will be denoted by like reference numerals between different arrangements for ease of comparison.

The input signal IN is received at the input node 32 (from a preceding stage 20 in the ring) and the output signal OUT is generated at the output node 34 (for passage to the next stage 20 in the ring). The pull-up network 42 is connected between the output node 34 and logic high 36 and the pull-down network is connected between the output node 34 and logic low 38.

The pull-up and pull-down networks 42 and 44 are connected, via the routing circuitry 40, to be controlled by the input signal IN and the input clock CLKin. Thus, the routing circuitry 40 may be considered a passive set of connections between the inputs (IN and CLKin) and the pull-up and pull-down networks 42 and 44. Where the stage $20_G$ is a configurable stage, one or both of the pull-up and pull-down networks 42 and 44 are also controlled by the mode configuration signal M.

The mode configuration signal M (which may be made up of component signals, for example denoted M1 and M2) is indicated within brackets as being optional, since if the stage $20_G$ is not configurable the mode configuration signal M is not needed. If the stage $20_G$ were arranged with the circuitry as actually depicted within the dashed box of FIG. 6 (to be considered later) for example, i.e. without being a configurable stage, then the mode configuration signal M is not needed. If the stage $20_G$ is configurable then the mode configuration signal M would be used. It will become apparent that FIG. 6 also represents the functionality of a configurable stage in mode A, and in that case the mode configuration signal M is needed. It is envisaged (as will become more apparent) that all of the stages $20_1$-$20_N$ (see FIG. 1) could be configurable in some arrangements.

The input clock CLKin is also indicated within brackets as being optional, although in most arrangements it will be used. For example, looking ahead to FIGS. 6 to 9 (to be considered later), the circuitry as actually depicted within the dashed boxes of FIGS. 6 to 8 (corresponding to modes A to C, respectively) requires the input clock CLKin but the circuitry as actually depicted within the dashed box of FIG. 9 (corresponding to mode I) does not. Thus, if the stage $20_G$ were arranged with the circuitry as actually depicted within the dashed box of FIG. 9 for example, i.e. without being a configurable stage, then the input clock CLKin is not needed. If the stage $20_G$ were a configurable stage, or a non-configurable stage in mode A, B or C, then the input clock CLKin is needed.

In use, based on the input signal IN (and where applicable the input clock CLKin and the mode configuration signal M), the voltage potential at the output node 34 is pulled up to or held at logic high or pulled down to or held at logic low, thereby generating the output signal OUT.

Figure 2B:
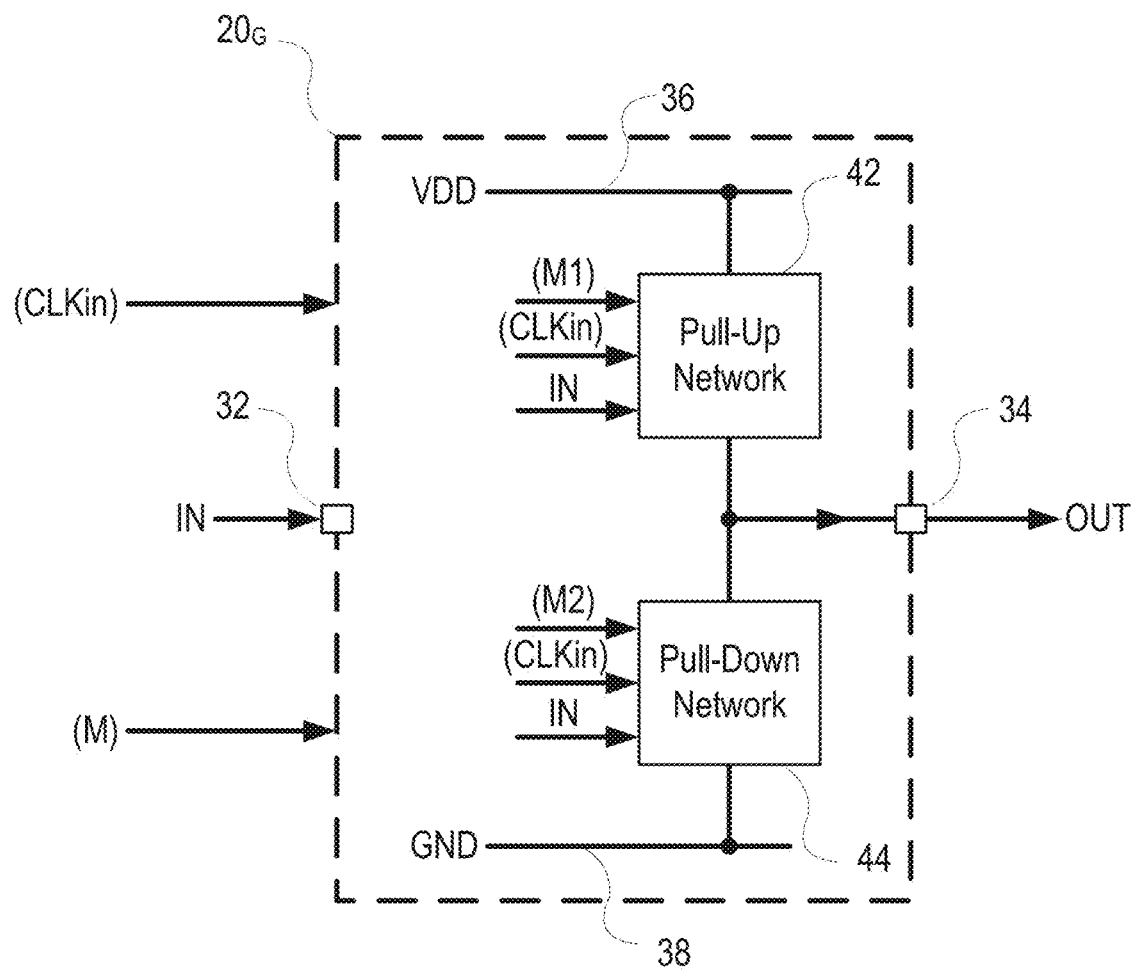

FIG. 2b is another schematic diagram of the generic stage $20_G$ of FIG. 2a, but presented slightly differently so that it can be seen that where there is a mode configuration signal M made up of M1 and M2, M1 is provided to the pull-up network 42 and M2 is provided to the pull-down network 44. Rather than showing the routing circuitry 40, explicit connections of the input signals to the pull-up and pull-down networks 42 and 44 are shown. Again various such signals are optional if the stage is a non-configurable stage.

Figure 3A:
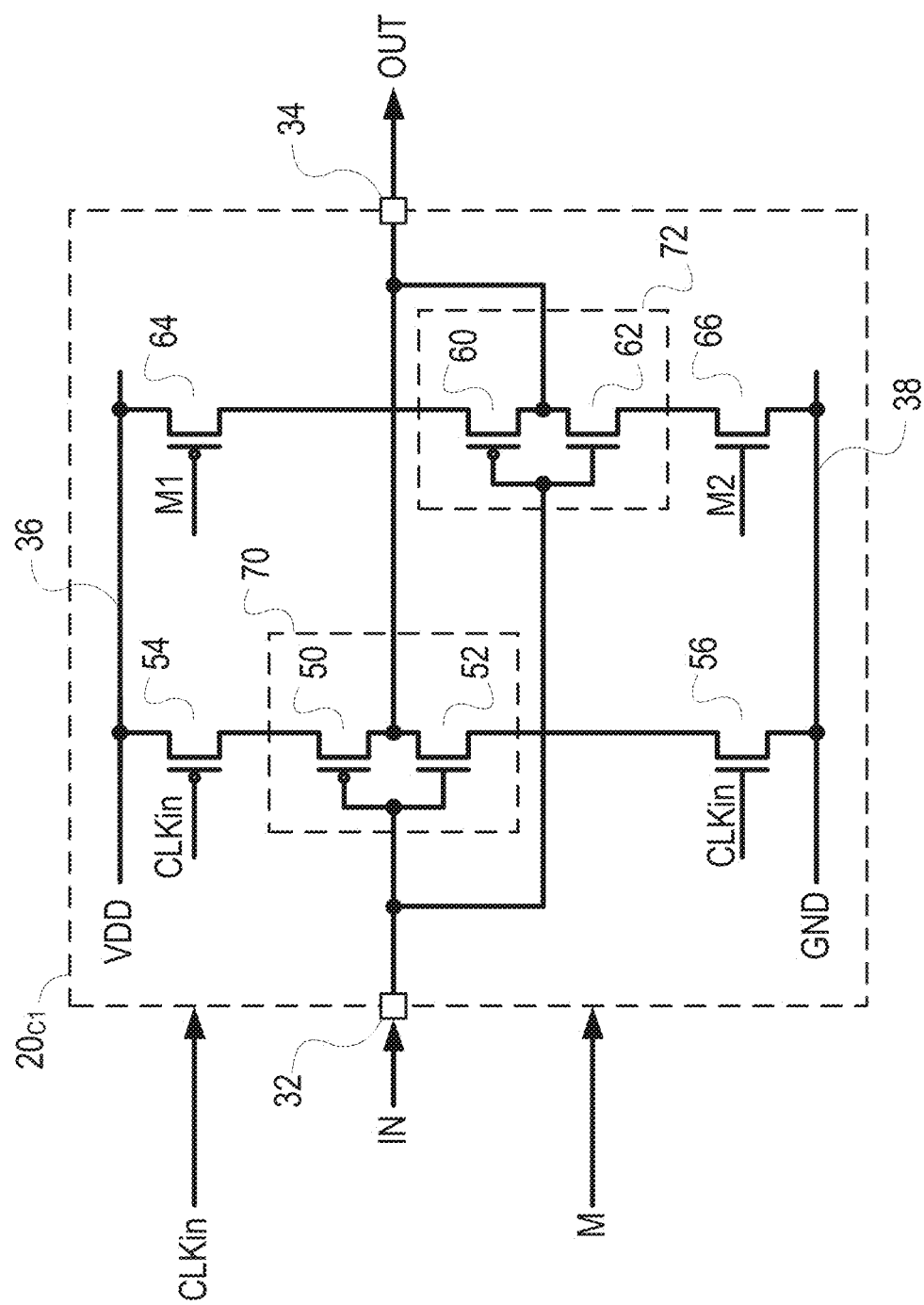
FIG. 3a is a schematic diagram of an example configurable stage for use in the divider circuitry of FIG. 1.

FIG. 3a is a schematic diagram of an example configurable stage 20 here denoted $20_{C1}$. It will be appreciated that various elements in configurable stage $20_{C1}$ correspond to elements in generic stage $20_G$, and duplicate description will be omitted.

Configurable stage $20_{C1}$ comprises a first CMOS inverter 70 that comprises a PMOS transistor 50 and an NMOS transistor 52. That is, the arrangement of the PMOS transistor 50 and the NMOS transistor 52 corresponds at first sight to that of a CMOS inverter, and the present disclosure will be understood accordingly. The PMOS transistor 50 of the first inverter 70 is connected to the high-side voltage VDD by (via) a PMOS transistor 54 and the NMOS transistor 52 of the first inverter 70 is connected to the low-side voltage GND by (via) an NMOS transistor 56.

Therefore, it can clearly be seen that PMOS transistors 50 and 54 are connected in series along a pull-up path between the output node 34 and the high-side voltage VDD, i.e. the logic high 36, and similarly NMOS transistors 52 and 56 are connected in series along a pull-down path between the output node 34 and the low-side voltage GND, i.e. logic low 38. Transistors 50 and 52, i.e. the first inverter 70, are connected to be controlled by the input signal IN and transistors 54 and 56 are connected to be controlled by the input clock CLKin, i.e. the reference signal CLKin.

Configurable stage $20_{C1}$ also comprises a second CMOS inverter 72 that comprises a PMOS transistor 60 and an NMOS transistor 62. The PMOS transistor of the second inverter 72 is connected to the high-side voltage VDD by a PMOS transistor 64 and the NMOS transistor 62 of the second inverter 72 is connected to the low-side voltage GND by an NMOS transistor 66.

Therefore, it can clearly be seen that the PMOS transistors 60 and 64 are connected in series along a pull-up path between the output node 34 and logic high 36, i.e. VDD, and similarly NMOS transistors 62 and 66 are connected in series along a pull-down path between the output node 34 and logic low 38, i.e. GND. Transistors 60 and 62, i.e. the second inverter 72, are connected to be controlled by the input signal IN and transistors 64 and 66 are connected to be controlled by the mode configuration signals M1 and M2, respectively. Mode configuration signals M1 and M2 may collectively (or individually) be equated or associated with the mode configuration signal M.

Figure 3B:
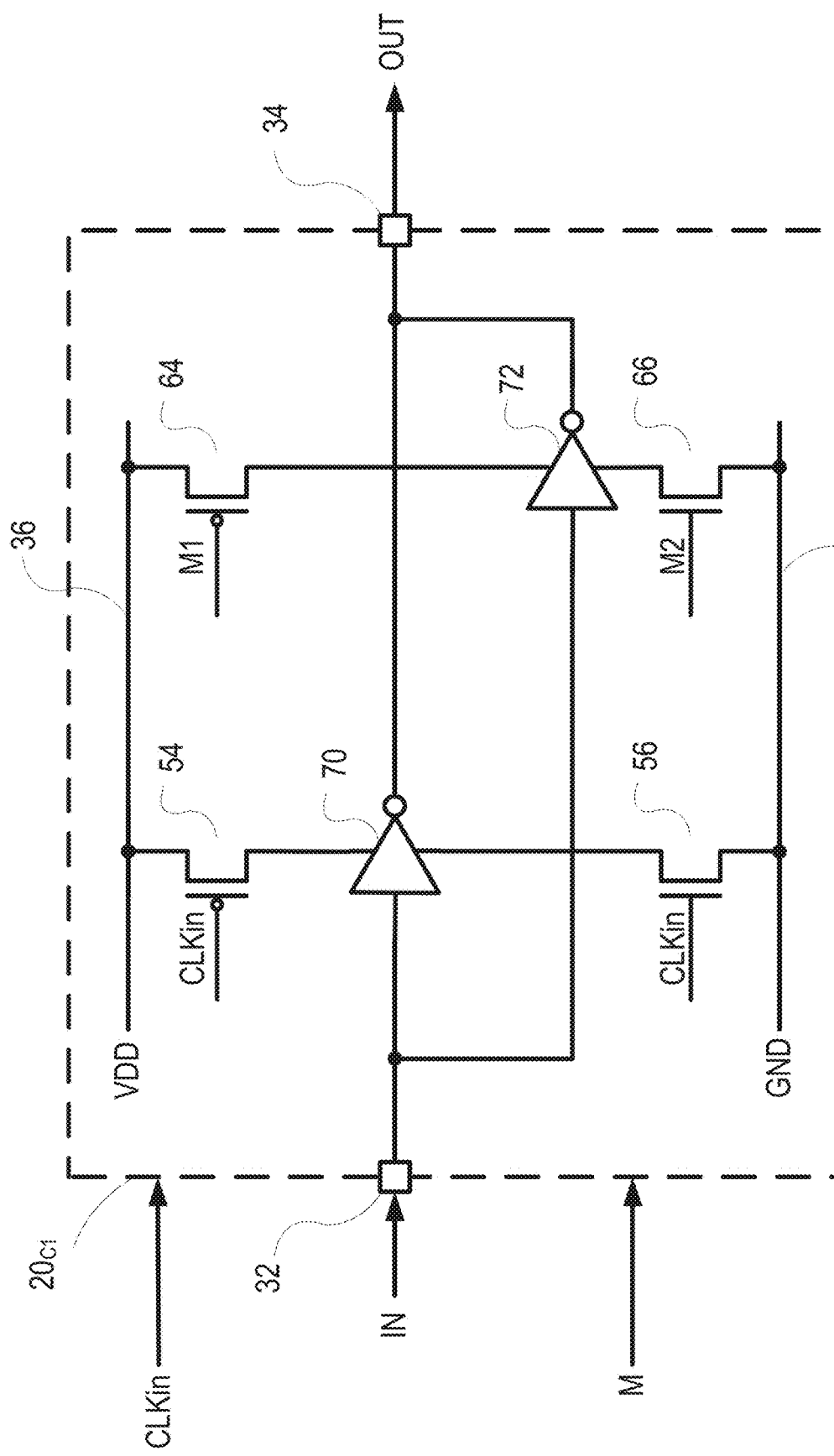

FIG. 3b is another schematic diagram of the configurable stage $20_{C1}$, but simplified by showing the inverters 70 and 72 using the standard circuit symbol for an inverter. It will be understood that the arrangement of the inverter 70 and the transistors 54 and 56 in FIG. 3b corresponds to the arrangement of the transistors 50, 52, 54 and 56 in FIG. 3a. Similarly, the arrangement of the inverter 72 and the transistors 64 and 66 in FIG. 3b corresponds to the arrangement of the transistors 60, 62, 64 and 66 in FIG. 3a. The present disclosure, where inverter circuit symbols are used, will be understood accordingly.

For ease of explanation, it will be assumed that the input clock CLKin is a digital clock signal whose (voltage) value thus alternates between logic high (or digital "1") and logic low (or digital "0"). Similarly, it will be assumed that the input and output signals IN and OUT switch between the digital values 1 and 0. It will further be assumed that the mode configuration signals M1 and M2 have either a 1 or 0 value.

Figure 3C:
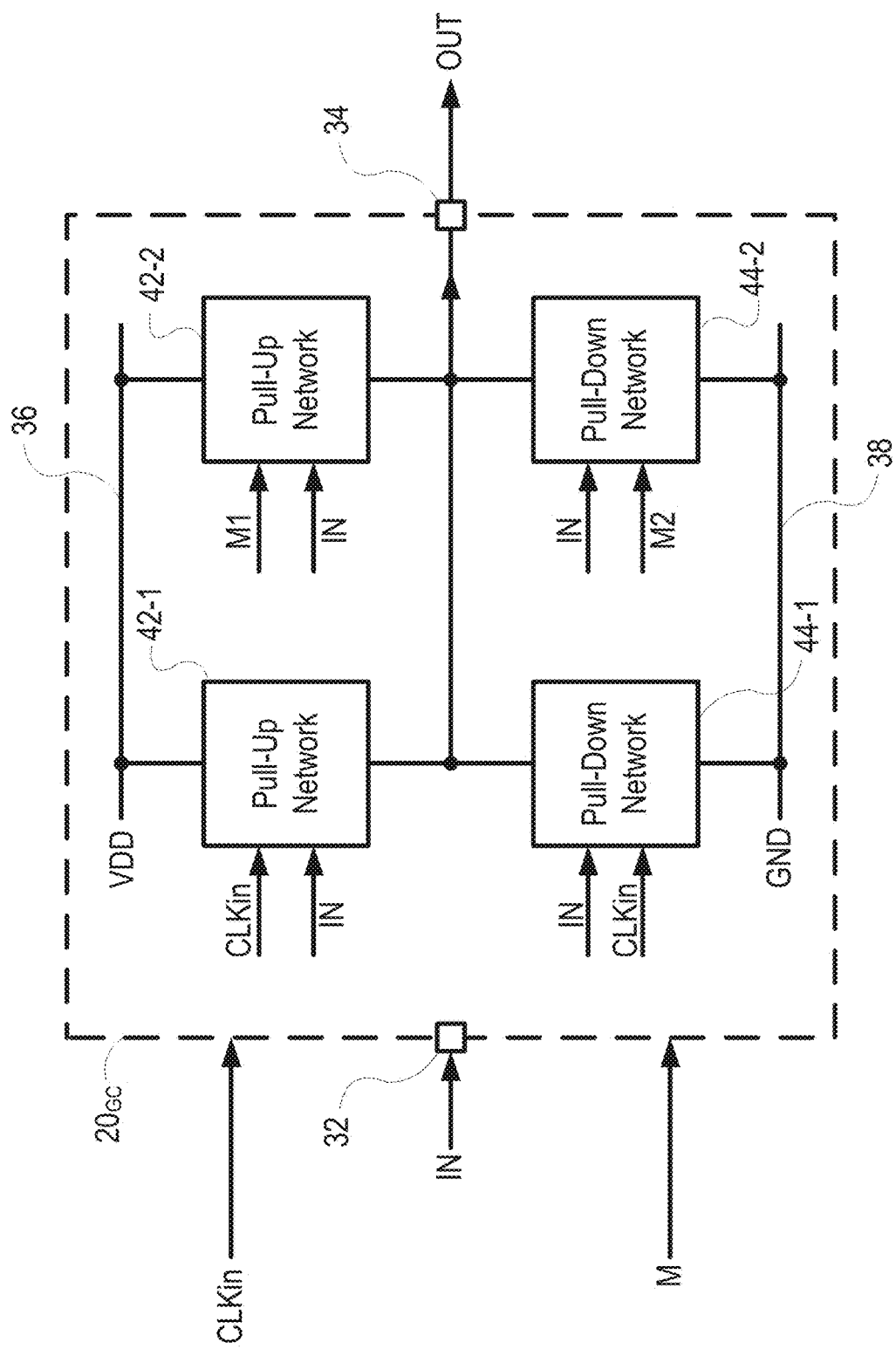
FIG. 3c is another schematic diagram of the generic stage FIG. 2b, but particularly aimed at being a configurable stage.

FIG. 3c is another schematic diagram of the generic stage $20_G$ of FIG. 2b, but particularly aimed at being a configurable stage (in line with those of FIGS. 3a and 3b) whose mode of operation can be configured and hence denoted $20_{GC}$. Thus, stage $20_{GC}$ of FIG. 3c is a generic configurable stage.

Stage $20_{GC}$ of FIG. 3c corresponds closely to stage $20_G$ of FIG. 2b, except that the pull-up network 42 has been divided into first and second pull-up networks 42-1 and 42-2 and the pull-down network 44 has been divided into first and second pull-down networks 44-1 and 44-2. This is so that it better corresponds to the configurable stage 20c, of FIGS. 3a and 3b. For example, the arrangement of the transistors 50, 52, 54 and 56 in FIG. 3a corresponds to the pull-up and pull-down networks 42-1 and 44-1. Since stage $20_{GC}$ is configurable, the input clock CLKin and the mode configuration signal M are provided.

Figure 4:
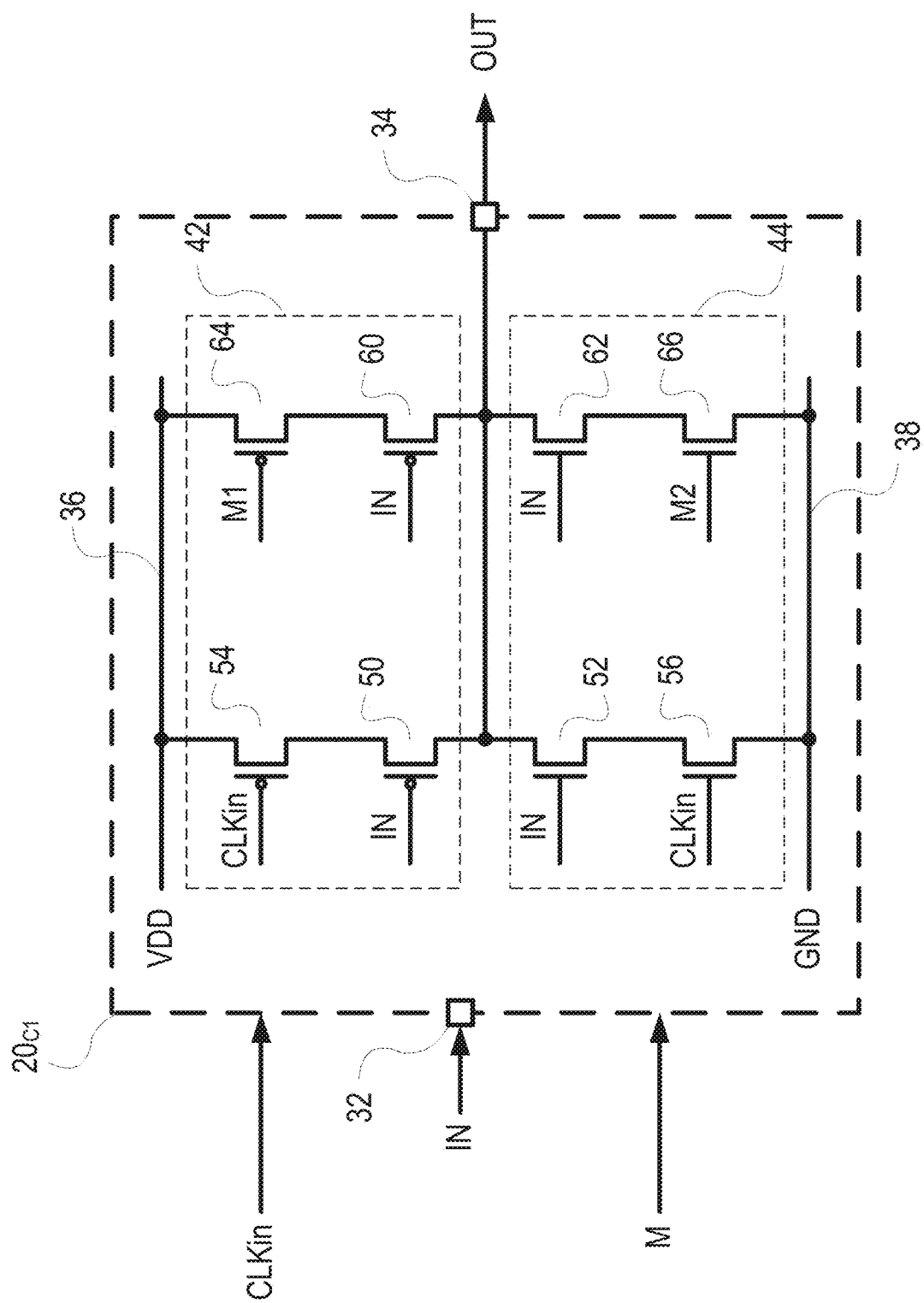
FIG. 4 is a schematic diagram showing another representation of the configurable stage of FIGS. 3a and 3b.

To help in an understanding of stage $20_{C1}$ of FIGS. 3a and 3b, another representation is presented in FIG. 4. The difference between FIGS. 3 and 4 is that in FIG. 4 the actual routings of the input signal IN to transistors 50, 52, 60 and 62, i.e. the first and second inverters 70 and 72, are not explicitly shown, to simplify the overall appearance of the circuit. To allow a ready comparison with FIG. 2a, the correspondence with the pull-up network 42 and pull-down network 44 is shown in FIG. 4.

Looking at FIGS. 3a, 3b and 4, when the input clock CLKin and the input signal IN both have the logic value 0, the pull-up path via transistors 50 and 54 is conductive whereas the pull-down path via transistors 52 and 56 is non-conductive, such that the output node 34 (i.e. the voltage level at the output node 34) is pulled up to or held at logic high, i.e. VDD. Conversely, when the input clock CLKin and the input signal IN both have the logic value 1, the pull-up path via transistors 50 and 54 is non-conductive whereas the pull-down path via transistors 52 and 56 is conductive, such that the output node 34 is pulled down to or held at logic low, i.e. GND.

Thus, when the input clock CLKin and the input signal IN have the same logic value as one another, the transistors 50, 52, 54 and 56 in combination effectively operate like a CMOS inverter.

For completeness, when the input clock CLKin and the input signal IN have different logic values from one another, the pull-up path via transistors 50 and 54 and the pull-down path via transistors 52 and 56 both become non-conductive. Therefore, both the pull-up and the pull-down paths are high impedance, cf. tri-state operation, which effectively removes the output of the pull-up and pull-down paths from the circuit. Thus, when the input clock CLKin and the input signal IN have different logic values from one another, the transistors 50, 52, 54 and 56 in combination effectively operate like the high impedance state of a tri-state CMOS inverter, i.e. a tri-state buffer.

Continuing the analysis, when the mode configuration signal M1 and the input signal IN both have the logic value 0, the pull-up path via transistors 60 and 64 is conductive, whereas the pull-down path via transistors 62 and 66 is non-conductive, such that the output node 34 is pulled up to or held at logic high. When the mode configuration signal M2 and the input signal IN both have the logic value 1, the pull-up path via transistors 60 and 64 is non-conductive whereas the pull-down path via transistors 62 and 66 is conductive, such that the output node 34 is pulled down to or held at logic low. Thus, whenever the mode signal M1 has the logic value 1 the pull-up path via transistor 64 is non-conductive, i.e. high impedance and can effectively be ignored, irrespective of the logic state of the input signal IN. Similarly, if the configuration signal M2 has the logic value 0 the pull-down path via transistor 66 remains non-conductive, i.e. high impedance, and can also effectively be ignored, irrespective of the logic state of the input signal IN.

Importantly, if the mode signal M1 has the logic value 0 then the pull-up path via the transistors 60 and 64 will be conductive if the input signal IN has the logic value 0, creating a conductive pull-up path irrespective of the logic value of the input clock CLKin. Similarly, if the configuration signal M2 has the logic value 1 then the pull-down path via transistors 62 and 66 will be conductive if the input signal IN has the logic value 1 creating a conductive pull-down path irrespective of the logic value of the input clock CLKin. In these cases, the possibility for the input clock CLKin to prevent a conductive pull-up or pull-down path from being present is effectively overridden.

These issues will be explored further in connection with FIGS. 5 to 9. As an aside, it will be appreciated that in practice there will be some parasitic capacitance (or, in some applications, also a designed-in capacitance) present, although not illustrated, between the input/output nodes 32 and 34 and the ground supply GND, which will affect the operation over the overall divider circuitry, producing effectively a memory effect at those nodes (consider when those nodes are in a high impedance state). The present disclosure will be understood accordingly.

FIG. 5 is a table useful for understanding the possible modes of operation offered by the mode/configuration signals M1 and M2 in the mode configurable stage $20_{C1}$ of FIGS. 3a, 3b and 4. Given that the configuration signals M1 and M2 can both adopt the logic value 1 or 0 as mentioned above, there are 4 possible combinations. These are shown in FIG. 5 along with an indication as to whether the corresponding transistors in e.g. FIG. 4 (transistor 64 for configuration signal M1, and transistor 66 for configuration signal M2) are caused to be ON or OFF.

Thus, as in FIG. 5, a mode of operation A corresponds to configuration signals M1 and M2 each having logic values 1; a mode of operation B corresponds to configuration signals M1 and M2 having logic values 1 and 0, respectively; a mode of operation C corresponds to configuration signals M1 and M2 each having logic values 0; and a mode of operation I corresponds to configuration signals M1 and M2 having logic values 0 and 1, respectively.

Figure 6:
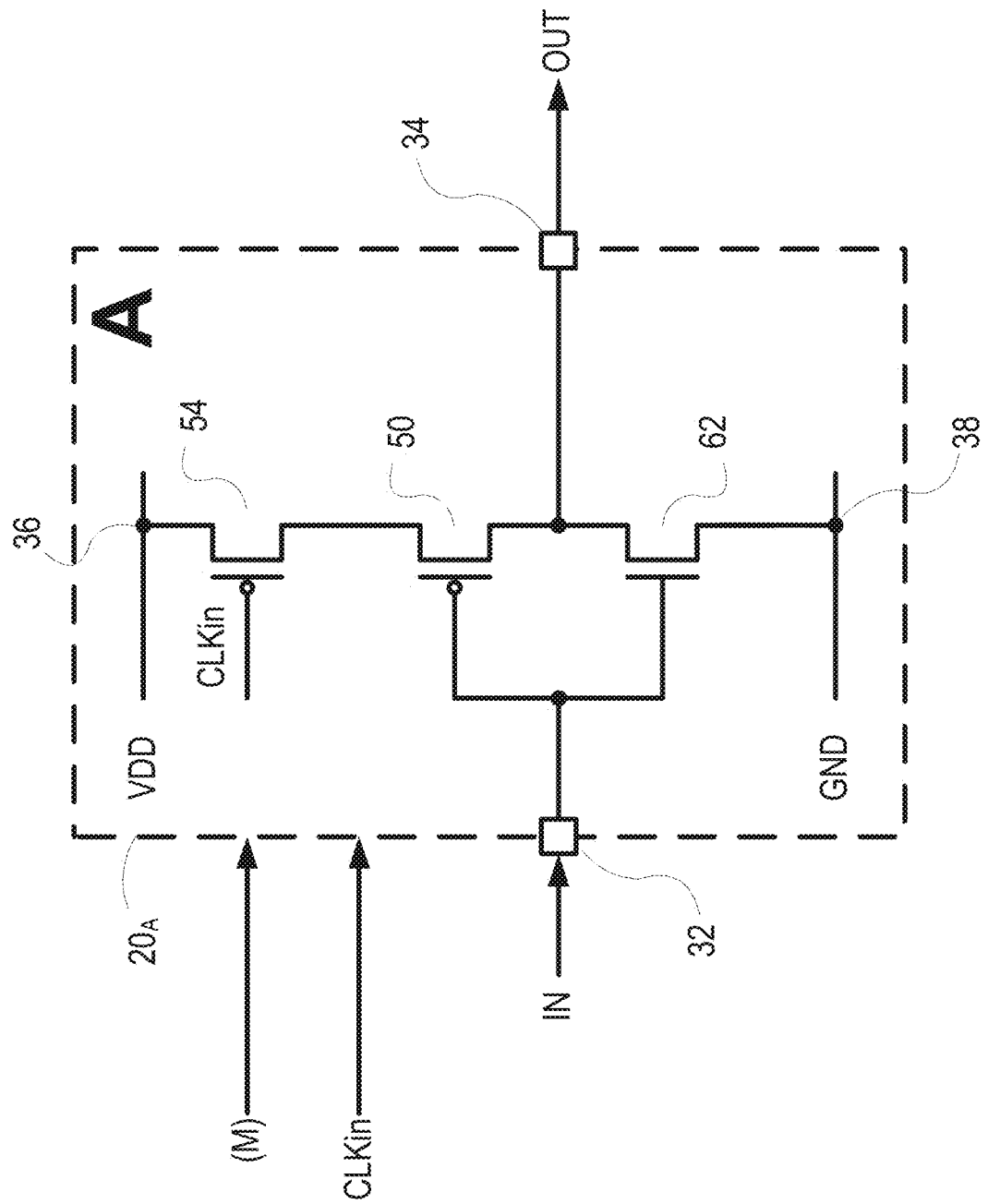
FIG. 6 is a schematic diagram of an example stage configured to operate in mode A.

FIG. 6 is a schematic diagram of an example stage 20, here denoted $20_A$, configured to operate in mode A. It will become apparent that the circuitry of stage $20_A$ may be provided as such, i.e. as a non-configurable stage arranged to operate in mode A only. The mode configuration signal M is shown as being optional to allow for this possibility. However, it will be explained that the circuitry of stage $20_A$ also corresponds to that of configurable stage $20_{C1}$ when configured by virtue of configuration signals M1 and M2 as in FIG. 5 to operate in mode A. In this case, the mode configuration signal M is of course needed.

The respective elements of stage $20_A$ correspond to those of stage $20_{C1}$ with like reference signs, and as such duplicate description will be omitted.

Looking back to configurable stage $20_{C1}$ of FIGS. 3a, 3b and 4 and the table of FIG. 5 for mode A, when the configuration signal M1 has the logic value 1, the PMOS transistor 64 is in the OFF state, i.e. high impedance or non-conducting, so the pull-up path via PMOS transistors 60 and 64 can never become conductive and thus that path can be ignored. Therefore, the only pull-up path provided in stage $20_A$ is that via PMOS transistors 50 and 54. Similarly, when the configuration signal M2 has the logic value 1 the NMOS transistor 66 is ON, so the pull-down path via NMOS transistors 62 and 66 will become conductive if the input signal IN has the logic value 1 independent of the input clock CLKin. Therefore, the only pull-down path provided in stage $20_A$ is that via NMOS transistors 62 and 66 with NMOS transistor 66 replaced with a simple connection since it is held in the ON state, i.e. low impedance or conducting. It should be noted that PMOS transistor 50 and NMOS transistor 62 act as a CMOS inverter, much like invertor 70 or 72, albeit with the need to take into account the presence also of PMOS transistor 54. The circuitry of stage $20_A$ is thus equivalent to how the circuitry of stage $20_{C1}$ behaves when in mode A.

Figure 7:
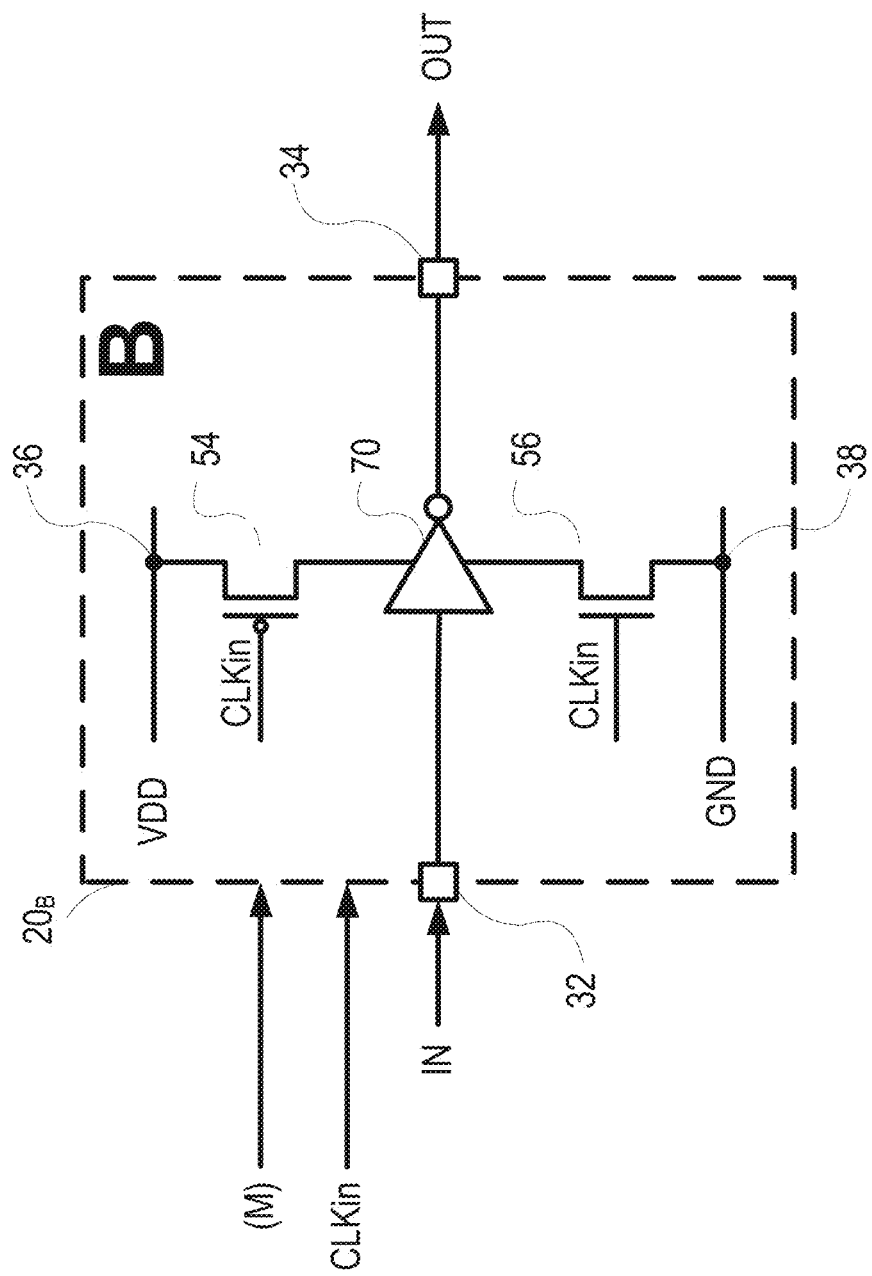
FIG. 7 is a schematic diagram of an example stage configured to operate in mode B.

FIG. 7 is a schematic diagram of an example stage 20, here denoted $20_B$, configured to operate in mode B. Again, the circuitry of stage $20_B$ may be provided as such, i.e. as a non-configurable stage arranged to operate in mode B only, however it may also correspond to that of configurable stage $20_{C1}$ when configured by virtue of configuration signals M1 and M2 as in FIG. 5 to operate in mode B. Similar considerations regarding the presence or absence of the mode configuration signal M as in FIG. 6 thus apply.

The respective elements of stage $20_B$ correspond to those of stage $20_{C1}$, with like reference signs, and as such duplicate description will be omitted.

Looking back to configurable stage $20_{C1}$ of FIGS. 3a, 3b and 4 and the table of FIG. 5 for mode B, when the configuration signal M1 has the logic value 1, the PMOS transistor 64 is OFF, so the pull-up path via PMOS transistors 60 and 64 can never become conductive and thus that path can be ignored. When the configuration signal M2 has the logic value 0 the NMOS transistor 66 is also OFF, so the pull-down path via NMOS transistors 62 and 66 can never become conductive and thus that path can also be ignored. Therefore, the only pull-up path provided in stage $20_B$ is that via PMOS transistors 50 and 54, and the only pull-down path provided in stage $20_A$ is that via NMOS transistors 52 and 56, wherein PMOS transistor 50 and NMOS transistor 52 constitute the CMOS inverter 70. The circuitry of stage $20_B$ is thus equivalent to how the circuitry of stage $20_{C1}$ behaves when in mode B.

Figure 8:
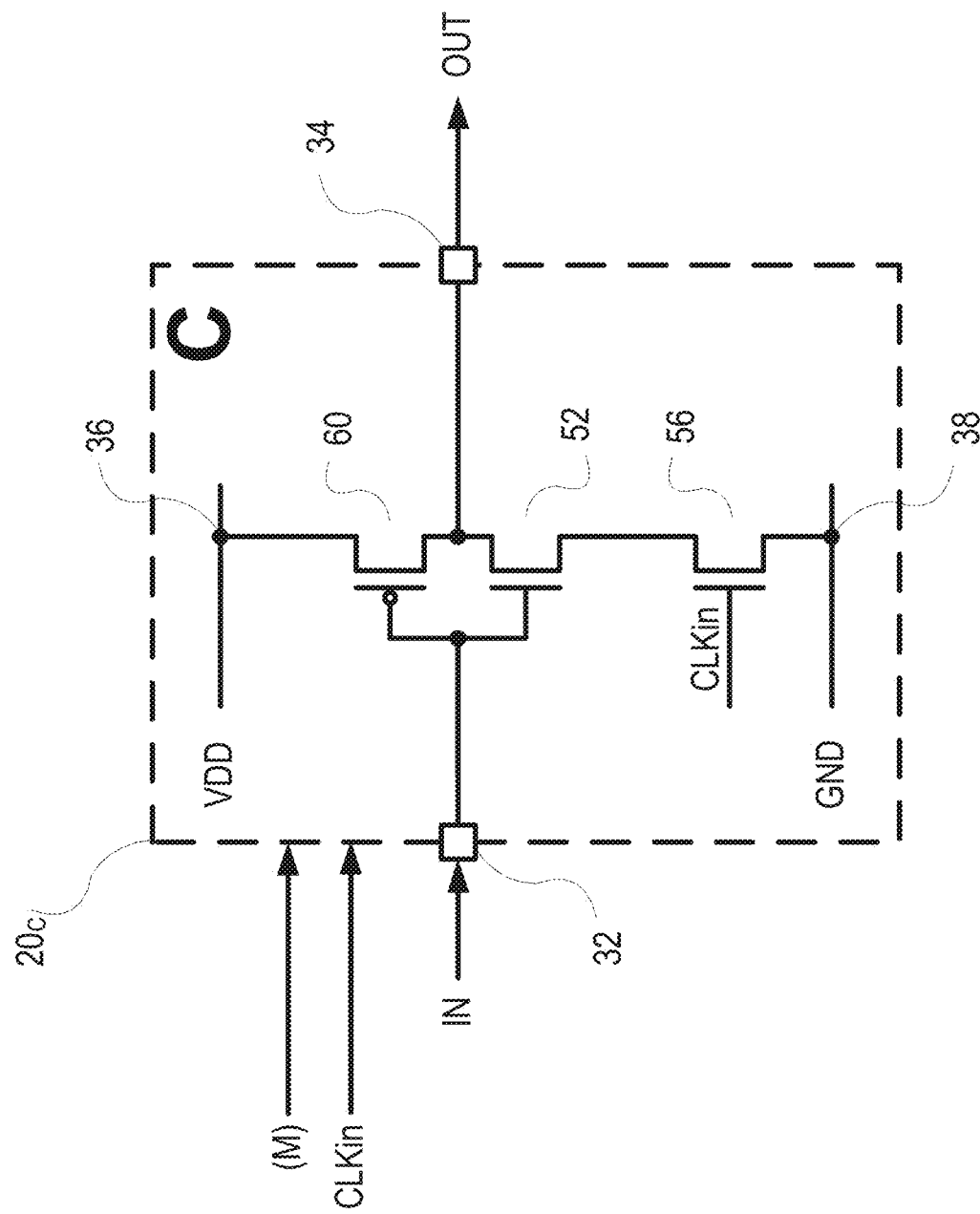
FIG. 8 is a schematic diagram of an example stage configured to operate in mode C.

FIG. 8 is a schematic diagram of an example stage 20, here denoted $20_C$, configured to operate in mode C. Again, the circuitry of stage $20_C$ may be provided as such, i.e. as a non-configurable stage arranged to operate in mode C only, however it also corresponds to that of configurable stage $20_C$ when configured by virtue of configuration signals M1 and M2 as in FIG. 5 to operate in mode C. Similar considerations regarding the presence or absence of the mode configuration signal M as in FIG. 6 thus apply.

The respective elements of stage $20_C$ correspond to those of stage $20_{C1}$ with like reference signs, and as such duplicate description will be omitted.

Looking again back to configurable stage $20_{C1}$ of FIGS. 3a, 3b and 4 and the table of FIG. 5 for mode C, when configuration signal M1 has the logic value 0 the PMOS transistor 64 is ON, so the pull-up path via PMOS transistors 60 and 64 will become conductive if the input signal IN has the value 0 independent of the input clock CLKin. Therefore, the only pull-up path provided in stage $20_C$ is that via PMOS transistors 60 and 64 with PMOS transistor 64 replaced with a simple connection since it is held ON. Similarly, when configuration signal M2 has the logic value 0 the NMOS transistor 66 is OFF, so the pull-down path via NMOS transistors 62 and 66 can never become conductive and thus that path can be ignored. Therefore, the only pull-down path provided in stage $20_C$ is that via NMOS transistors 52 and 56. The circuitry of stage $20_C$ is thus equivalent to how the circuitry of stage $20_{C1}$ behaves when in mode C.

Figure 9:
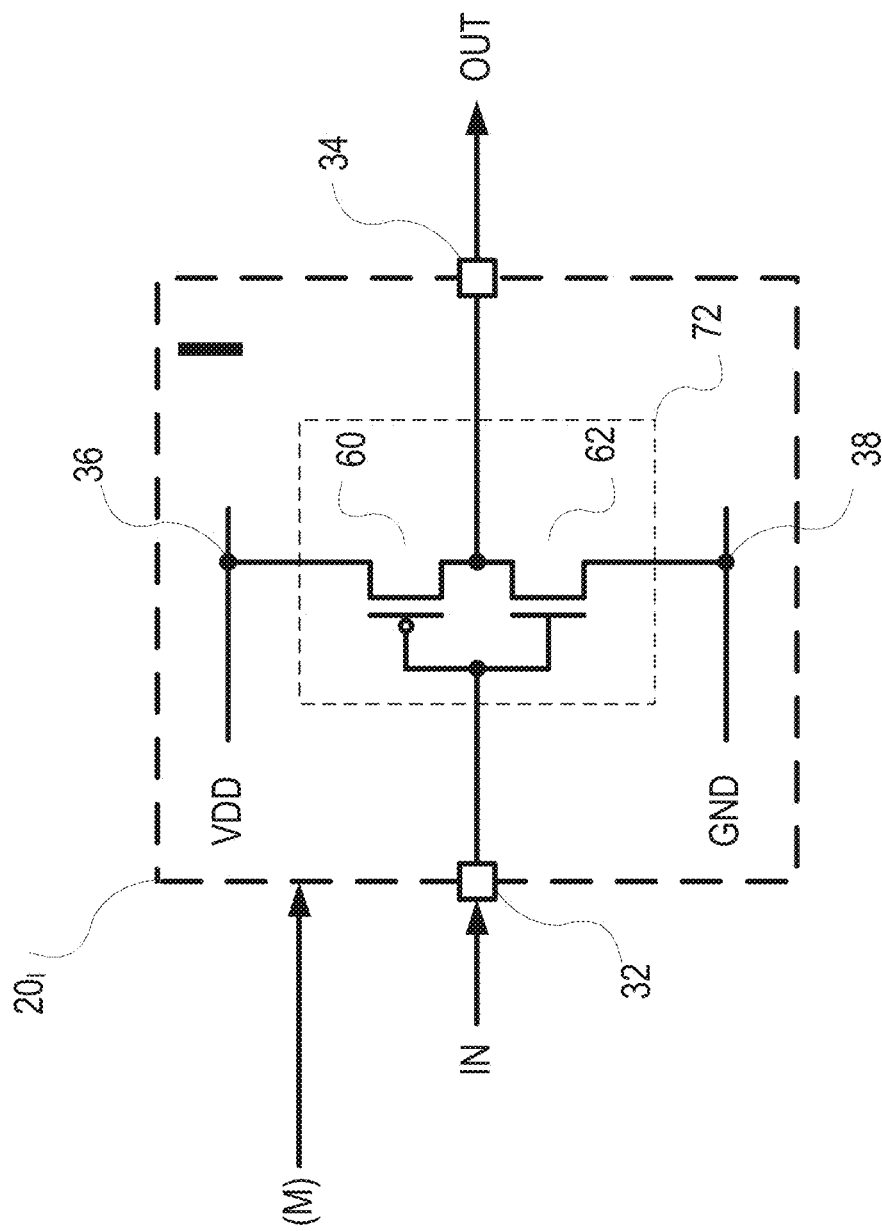
FIG. 9 is a schematic diagram of an example stage configured to operate in mode I.

FIG. 9 is a schematic diagram of an example stage 20, here denoted $20_I$, configured to operate in mode I. The circuitry of stage $20_I$ may be provided as such, i.e. as a non-configurable stage arranged to operate in mode I only, however it also corresponds to that of configurable stage $20_{C1}$ when configured by virtue of configuration signals M1 and M2 as in FIG. 5 to operate in mode I. Similar considerations regarding the presence or absence of the mode configuration signal M as in FIG. 6 thus apply.

The respective elements of stage $20_I$ correspond to those of stage $20_{C1}$ with like reference signs, and as such duplicate description will be omitted.

Looking back to configurable stage $20_{C1}$ of FIGS. 3a, 3b and 4 and the table of FIG. 5 for mode I, when configuration signal M1 has the logic value 0 the PMOS transistor 64 is ON, so the pull-up path via PMOS transistors 60 and 64 will become conductive if the input signal IN has the logic value 0 independent of the input clock CLKin. Therefore, the only pull-up path provided in stage $20_I$ is that via PMOS transistors 60 and 64 with PMOS transistor 64 replaced with a simple connection since it is held ON. Similarly, when configuration signal M2 has the logic value 1 the NMOS transistor 66 is ON, so the pull-down path via NMOS transistors 62 and 66 will become conductive if the input signal IN has the logic value 1 independent of the input clock CLKin. Therefore the only pull-down path provided in stage $20_I$ is that via NMOS transistors 62 and 66 with NMOS transistor 66 replaced with a simple connection since it is held ON. The circuitry of stage $20_I$ is thus equivalent to how the circuitry of stage $20_{C1}$ behaves when in mode I. It will be noted that mode I is referred to as the "inverter" mode, hence "I", given that the circuitry of stage $20_I$ self-evidently corresponds to a CMOS inverter.

A stage 20 in mode I may thus be useful as an inverting buffer. For example, by putting two of them in series there is provided a non-inverting buffer. Each stage may 20 may have such a buffer on its output node 34, for example to enable e.g. the overall output clock CLKout (target signal) to be tapped off. See for example FIGS. 11b, 13b and 18, which are considered later.

Figure 10:
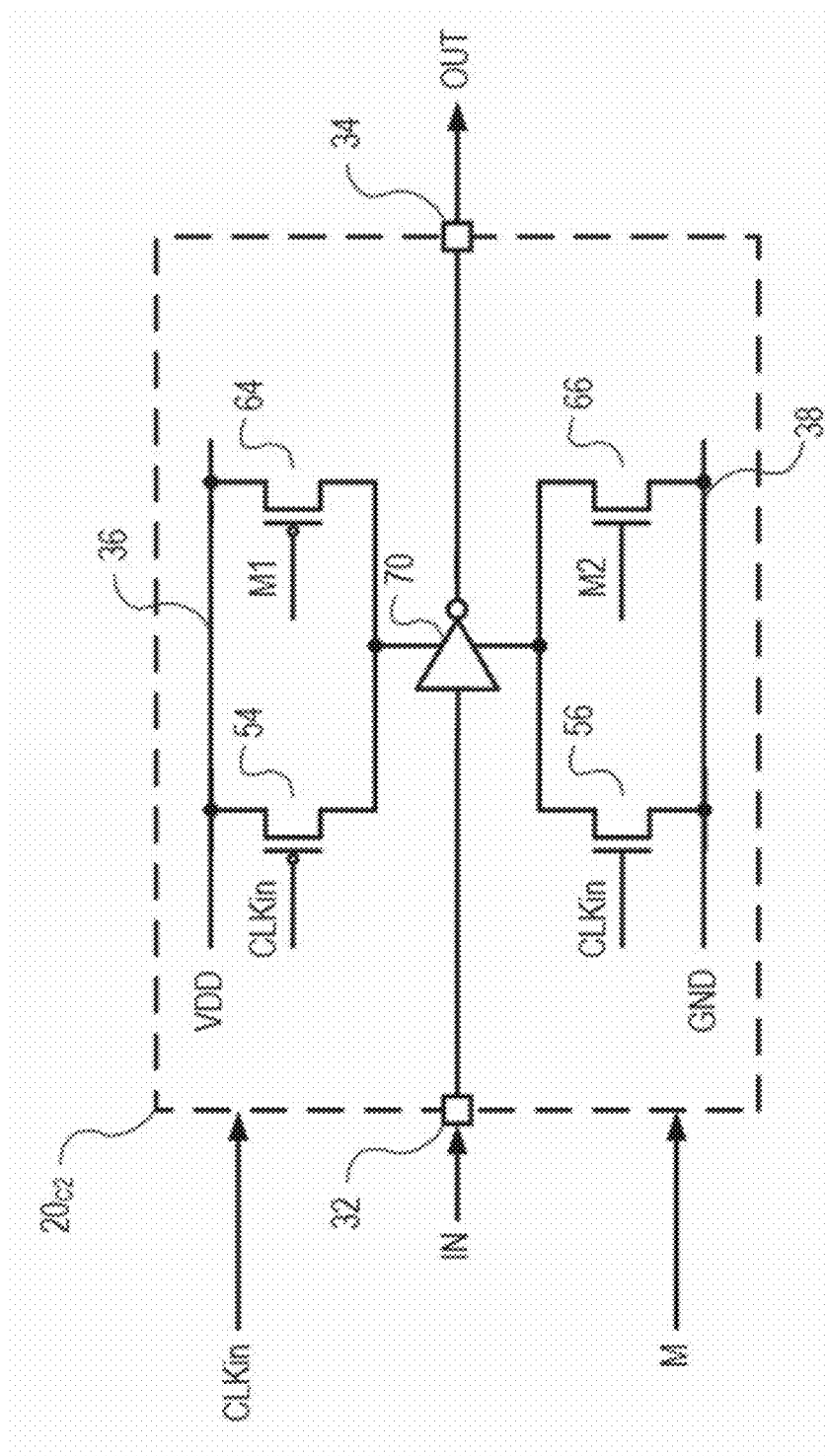
FIG. 10 is a schematic diagram of another example configurable stage for use in the divider circuitry of FIG. 1.

FIG. 10 is a schematic diagram of an example configurable stage 20, here denoted $20_{C2}$. It will be appreciated that elements in configurable stage $20_{C2}$ correspond to elements in configurable stage $20_{C1}$, with like reference signs, and duplicate description will be omitted.

By comparing FIGS. 4 and 10, it will be understood that the difference between stages $20_{C2}$ and $20_{C1}$ is that the two pull-up paths (via PMOS transistors 50 and 54, and via PMOS transistors 60 and 64) of stage $20_{C1}$ have partly been combined in stage $20_{C2}$ such that they share the same input-signal-controlled NMOS transistor 50 of inverter 70 (removing the need for PMOS transistor 60 in stage $20_{C2}$). Similarly, the two pull-down paths (via NMOS transistors 52 and 56, and via NMOS transistors 62 and 66) of stage $20_{C1}$ have partly been combined in stage $20_{C2}$ such that they share the same input-signal-controlled NMOS transistor 52 (removing the need for NMOS transistor 62 in stage $20_{C2}$).

Thus, it will be recognised that the basic operation of stage $20_{C2}$ is the same as that of stage $20_{C1}$, so that stages $20_A$, $20_B$, $20_C$ and $20_I$ of FIGS. 6 to 9 apply also to stage $20_{C2}$ of FIG. 10, and duplicate description concerning the operation of stage $20_{C2}$ will be omitted.

It is incidentally noted that stage $20_{C1}$ (for example, as compared to stage $20_{C2}$) is considered to minimise parasitic-capacitance related effects, to minimise power consumption and maximise operating frequency range.

Looking back to FIG. 1, any of the stages described in relation to FIGS. 2 to 10 may be used as a stage 20 in the divider circuitry 10. Thus, any or all (e.g. all but one, or any value from 1 to N) of the stages 20 may be configurable stages, which are configured by the (mode) configuration signal M to operate in a particular mode of operation. Similarly, any or all (e.g. all but one, or any value from 1 to N) of the stages may be non-configurable stages, e.g. arranged to operate only in a given mode as depicted in one of FIGS. 6 to 9.

Of course, the PMOS transistor 64 and NMOS transistor 66 of stage $20_{C1}$ or $20_{C2}$ could be arranged such that they are (always) held either ON or OFF, i.e. without needing configuration signals M1 and M2, such that that stage effectively becomes a non-configurable stage. Thus, both configurable and non-configurable stages may be provided using effectively the same circuitry. The circuitry of stage $20_{C1}$ or $20_{C2}$ could thus be arranged as a convenient cell (e.g. a macro in a circuit design application) which may be repeated to produce divider circuitry 10.

As another possibility, looking at FIG. 4, the pull-down path having the NMOS transistors 62 and 66 could be omitted so that only modes B and C are available, or the pull-up path having PMOS transistors 60 and 64 could be omitted so that only modes A and B are available. Thus, the degree to which a particular stage is configurable can be different from stage to stage.

Figure 11A:
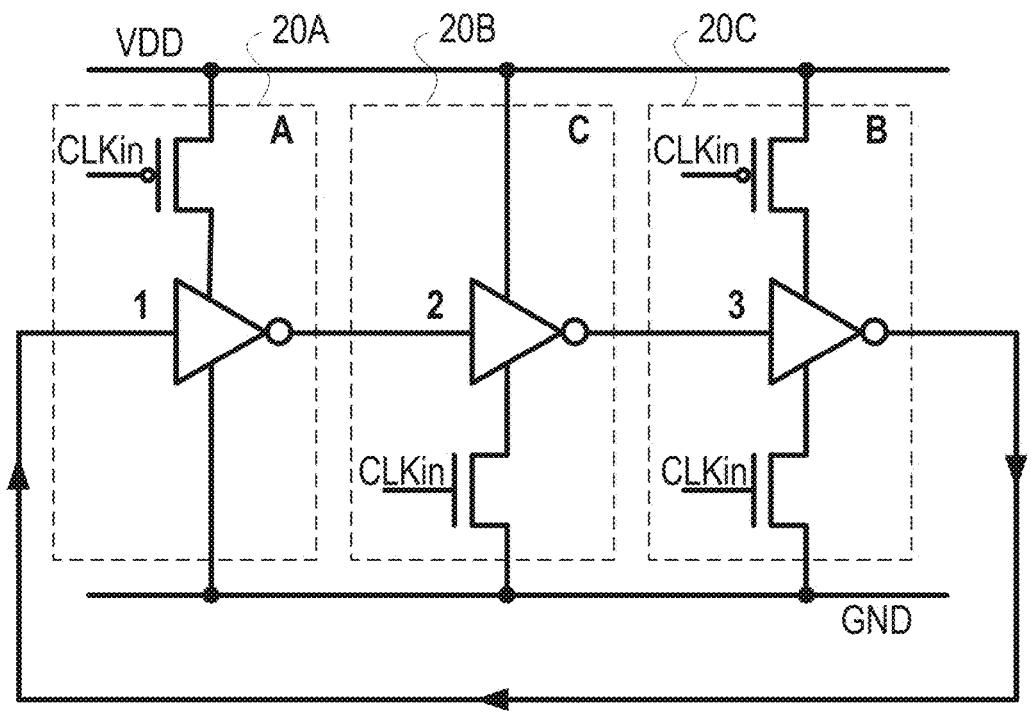
FIGS. 11a and 11b are a schematic diagrams representing a particular implementation of the FIG. 1 divider circuitry.
Figure 11A:
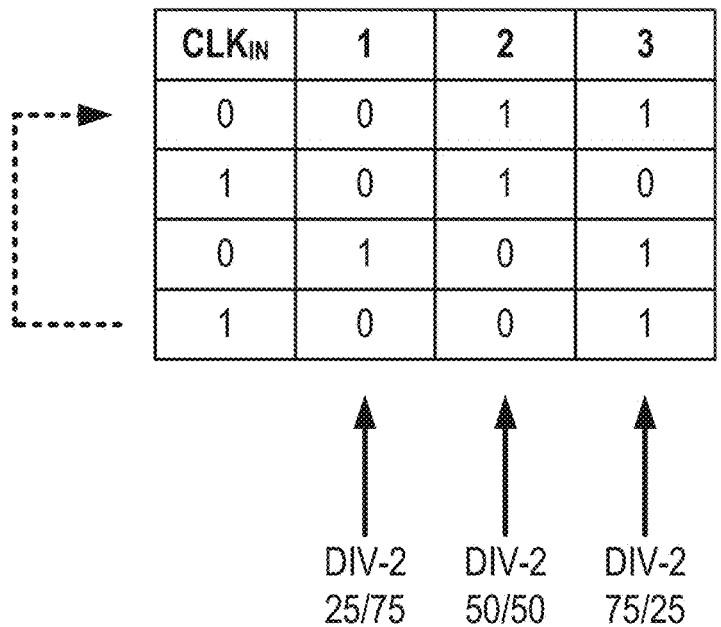
Figure 11B:
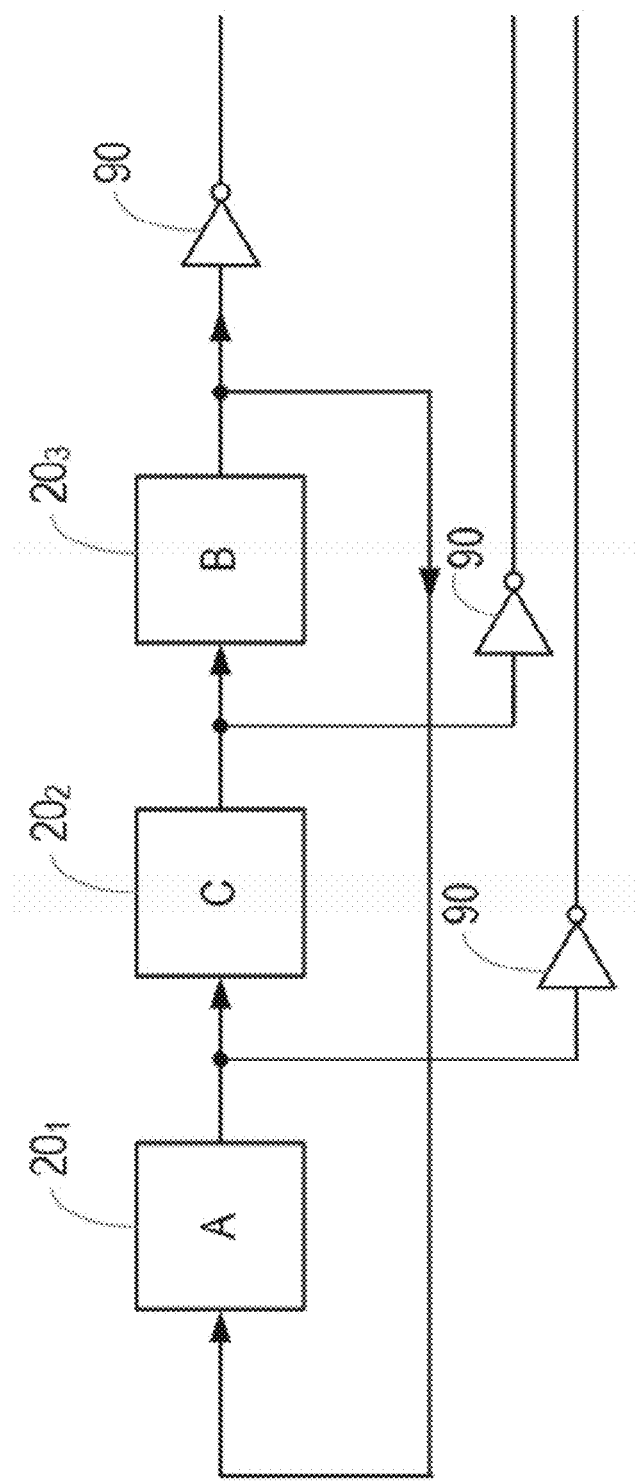
Figure 12:
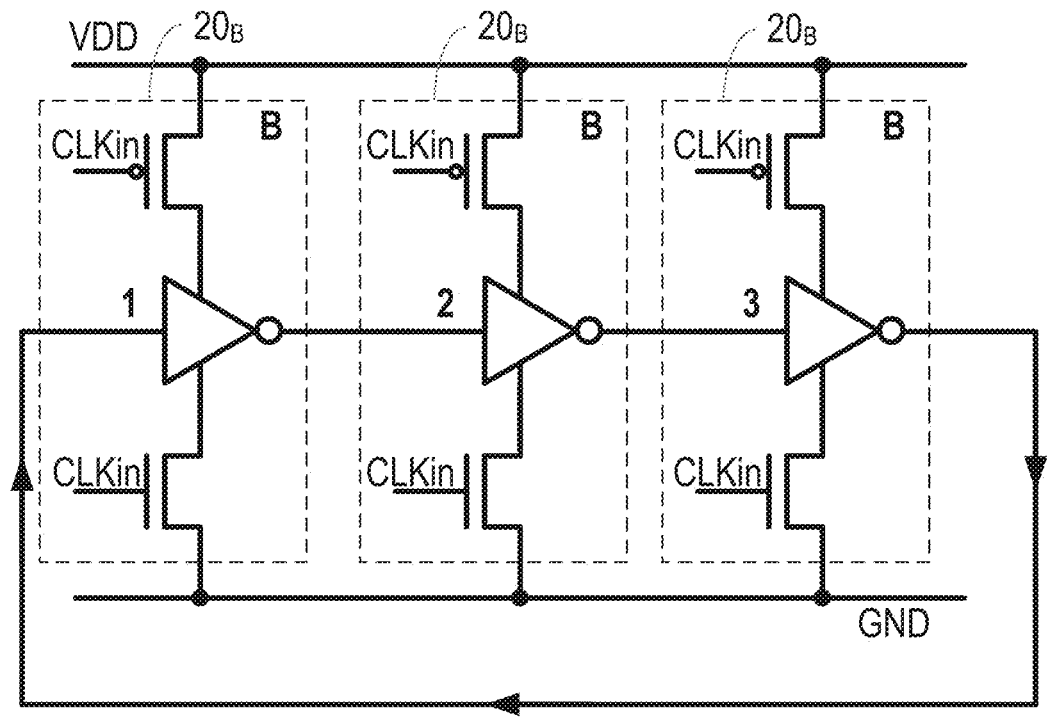
FIG. 12 is a schematic diagram representing another particular implementation of the FIG. 1 divider circuitry.
Figure 12:
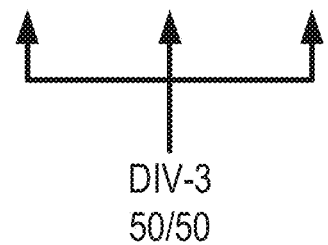

Operation of the divider circuitry 10 will now be explored in connection with FIGS. 11 to 13.

For simplicity, where a stage is configured to operate in mode A, B or C the corresponding circuitry will be shown using the relevant circuitry depicted in FIGS. 6 to 8. However, it will be understood that any or all of the stages could also be represented using configurable stage circuitry such as that of stage $20_{C1}$ along with the appropriate configuration signals M1 and M2.

FIG. 11a is a schematic diagram representing an implementation of divider circuitry 10, where the number of stages N in the ring, i.e. in the loop, is 3 and the combination of modes is ACB (or CBA or BAC depending on where in the loop the start point is taken).

Representative circuitry is shown (where the circuitry corresponds to that in FIGS. 6 to 8) in the upper half of the figure and a table of signal states is shown in the lower half. FIG. 11b presents corresponding representative circuitry following the format shown in FIG. 1 (and including inverting buffers 90 connected to the intermediate nodes between the stages to allow the overall output clock CLKout (target signal) to be tapped off from any of them as mentioned above).

The columns in the table of FIG. 11a correspond respectively to the input clock CLKin and the three intermediate nodes 1, 2 and 3 between the three stages, as indicated. For the sake of argument, it is assumed that the input clock CLKin and the nodes start in an initial state as in the first row of the table. The value of the input clock CLKin then continuously alternates between 0 and 1, with successive values given a new row in the table so that progression of time (or progression of states) effectively corresponds to progression from row to row in the table. Every time the input clock CLKin changes in value, the value of the output/input signal at one or more of the intermediate nodes, i.e. the outputs/inputs of the inverters, is caused to change. By working down through the rows one by one, each time entering the new values at the intermediate nodes based on the change in the value of the input clock CLKin, it will be appreciated that a repeating pattern emerges as indicated by the dashed arrow at the left-hand side of the table, so that the group of rows shown in FIG. 11a in fact repeats.

By comparing the signals at the intermediate nodes with the input clock CLKin, it can be seen that the intermediate node 1 provides a divide-by-2 (DIV-2) signal with a 25/75 duty cycle (duty cycle of logic 1's to logic 0's); the intermediate node 2 provides a DIV-2 signal with a 50/50 duty cycle; and the intermediate node 3 provides a DIV-2 signal with a 75/25 duty cycle. Thus, all of the intermediate nodes in FIGS. 11a and 11b provide a DIV-2 signal and any one of them could be connected to the overall output of the divider circuitry 10 to provide the output clock, i.e. target signal, CLKout. See FIG. 11b.

Of course, it may be that two or more different target output clock signals (CLKout1, CLKout2) are desired, for example as provided at two or more of the intermediate nodes. It would of course be possible to route signals from all three intermediate nodes to a selector circuit (not shown), so that any of them or any combination of them may be output as target signals. Again see FIG. 11b.

FIG. 12 is a schematic diagram representing another implementation of divider circuitry 10, where the number of stages N is 3 and the combination of modes is BBB. FIG. 12 is thus similar to FIG. 11a, except that the combination of modes is different.

Looking at FIG. 12, it can be seen that all of the intermediate nodes provide a DIV-3 signal with a 50/50 duty cycle. However, the three DIV-3 signals are time-interleaved with one another. Depending on the application, it may be that any or all of these are output as the required output clock CLKout.

Such time-interleaved signals may be useful in various applications. Indeed, multiple output clocks have many possible applications, including inter alia interleaving, modulation, demodulation, signal filtering (polyphase), pseudo random number generation, charge pumps, DC-DC converters/power converters and PLLs (phase-lock loops).

Figure 13A:
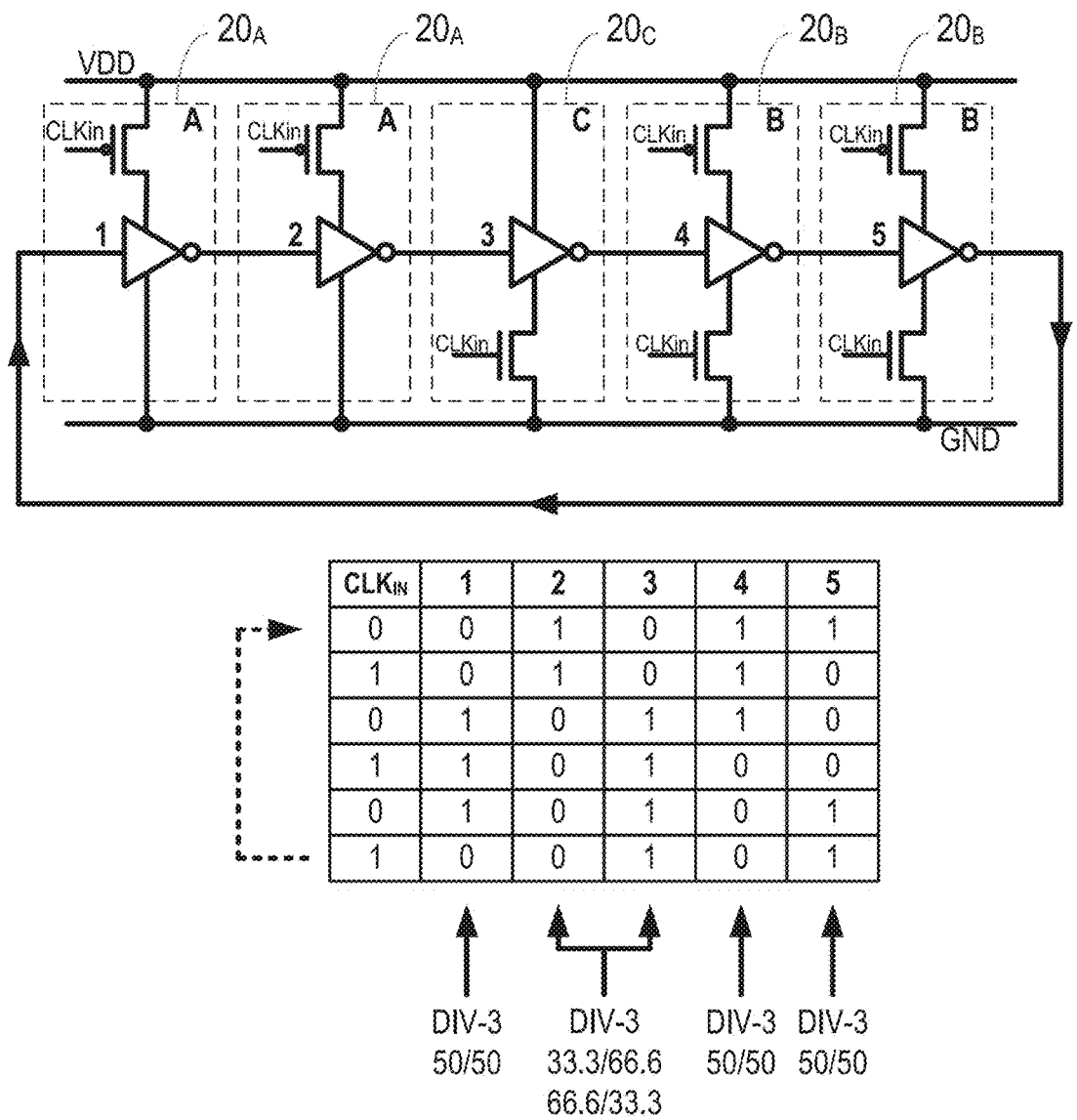
FIGS. 13a and 13b are a schematic diagrams representing a further particular implementation of the FIG. 1 divider circuitry.

FIG. 13a is a schematic diagram representing yet a further implementation of divider circuitry 10, where the number of stages N is 5 and the combination of modes is AACBB. As a result, there are five intermediate nodes 1, 2, 3, 4 and 5 between the stages as indicated.

FIG. 13a is thus similar to FIG. 11a, except that both the number of stages N and the combination of modes is different.

Figure 13B:
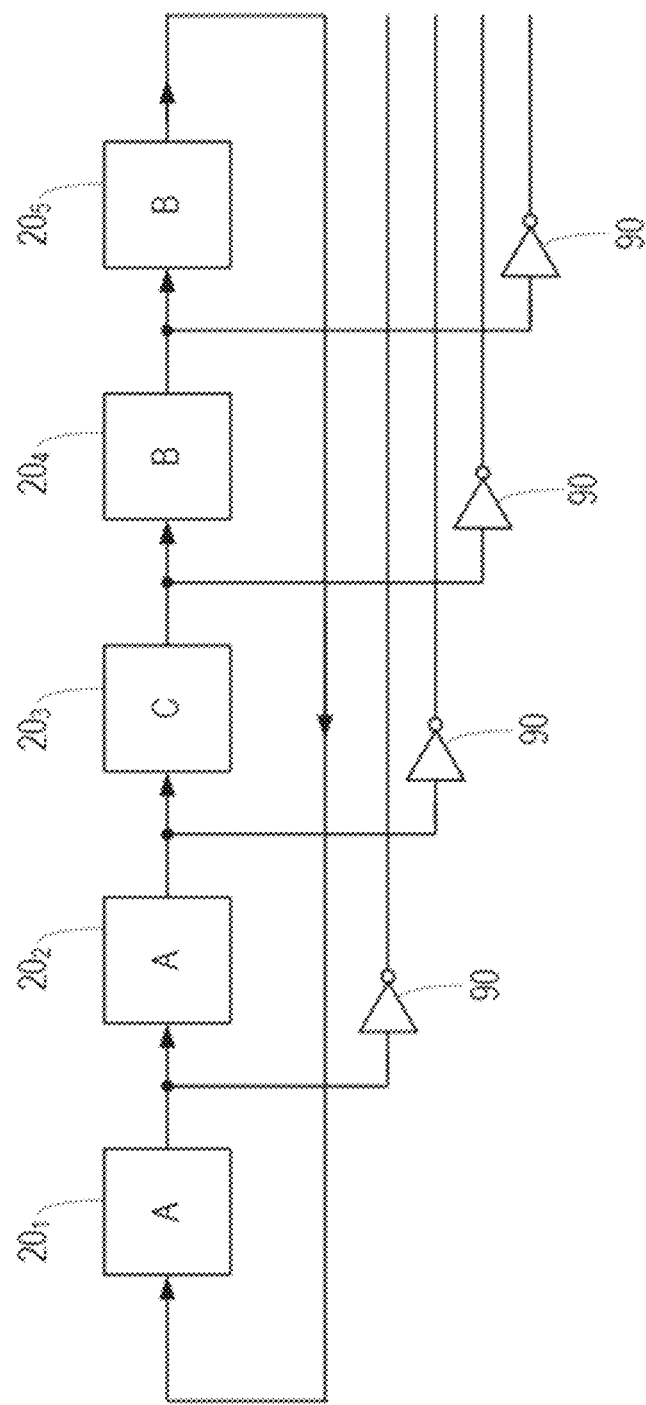

FIG. 13b presents corresponding representative circuitry following the format shown in FIG. 1 (and including inverting buffers 90 connected to the intermediate nodes between the stages to allow the overall output clock CLKout (target signal) to be tapped off from any of them as mentioned above). FIG. 13b is thus similar to FIG. 11b.

Looking at FIGS. 13a and 13b, it can be seen that the intermediate nodes 1, 4 and 5 provide a DIV-3 signal with a 50/50 duty cycle (duty cycle of logic 1's to logic 0's), those signals being time-interleaved. Intermediate nodes 2 and 3 provide DIV-3 signals with 33.33/66.66 and 66.66/33.33 duty cycles, respectively.

FIG. 14 is a table indicating combinations of modes where the number of stages N is 3, and FIG. 15 is a table indicating combinations of modes where the number of stages N is 5.

The combinations considered in FIGS. 11 and 12 are included in the table of FIG. 14, along with a further combination which provides a DIV-1 operation. Thus, it is apparent that with N=3, it is possible to achieve all of the integer divider ratios Di from 1 to N by different combinations of modes. Also, it can be seen that this flexibility can be achieved even though one of the stages (in this case, stage 3) has the same mode of operation (in this case, mode B) in all of the combinations. Thus, the flexibility could be provided with stages 1 and 2 being configurable stages (see e.g. FIGS. 3a, 3b, 4 and 10) and stage 3 being a non-configurable stage (see FIGS. 6 to 9).

Turning to FIG. 15, the combination considered in FIG. 13 has been included in the table along with other combinations, to again demonstrate that with N=5 it is possible to achieve all of the integer divider ratios Di from 1 to N by different combinations of modes. It will be appreciated that the comments regarding flexibility in relation to FIG. 14 and N=3, of course apply analogously to FIG. 15 and N=5.

FIG. 16 is a table extending the teaching of FIGS. 14 and 15 to apply to any (odd) number N of stages. The pattern of modes has been highlighted by emphasizing the stages having mode C. Note that for all of the indicated divider ratios, the Nth stage (i.e. at least one of the stages) operates in mode B. Further, for all of the indicated divider ratios except DIV-1 (Di=1) and DIV-N(Di=N), only one of the stages operates in mode C. Further, for each divider ratio, the stages operating in mode A are grouped together, and the stages operating in mode B are grouped together. Further, as the divider ratio Di increases, the number of stages operating in mode A progressively decreases (from N−1 to 0) and the number of stages operating in mode B increases (from 1 to N, but not regularly at the beginning and end of the progression). Incidentally, this pattern simply represents one convenient way of determining combinations which will provide given integer divider ratios Di. Many other combinations are possible, especially with increasing N. The principles disclosed herein can be applied to other combinations equally.

Figure 17:
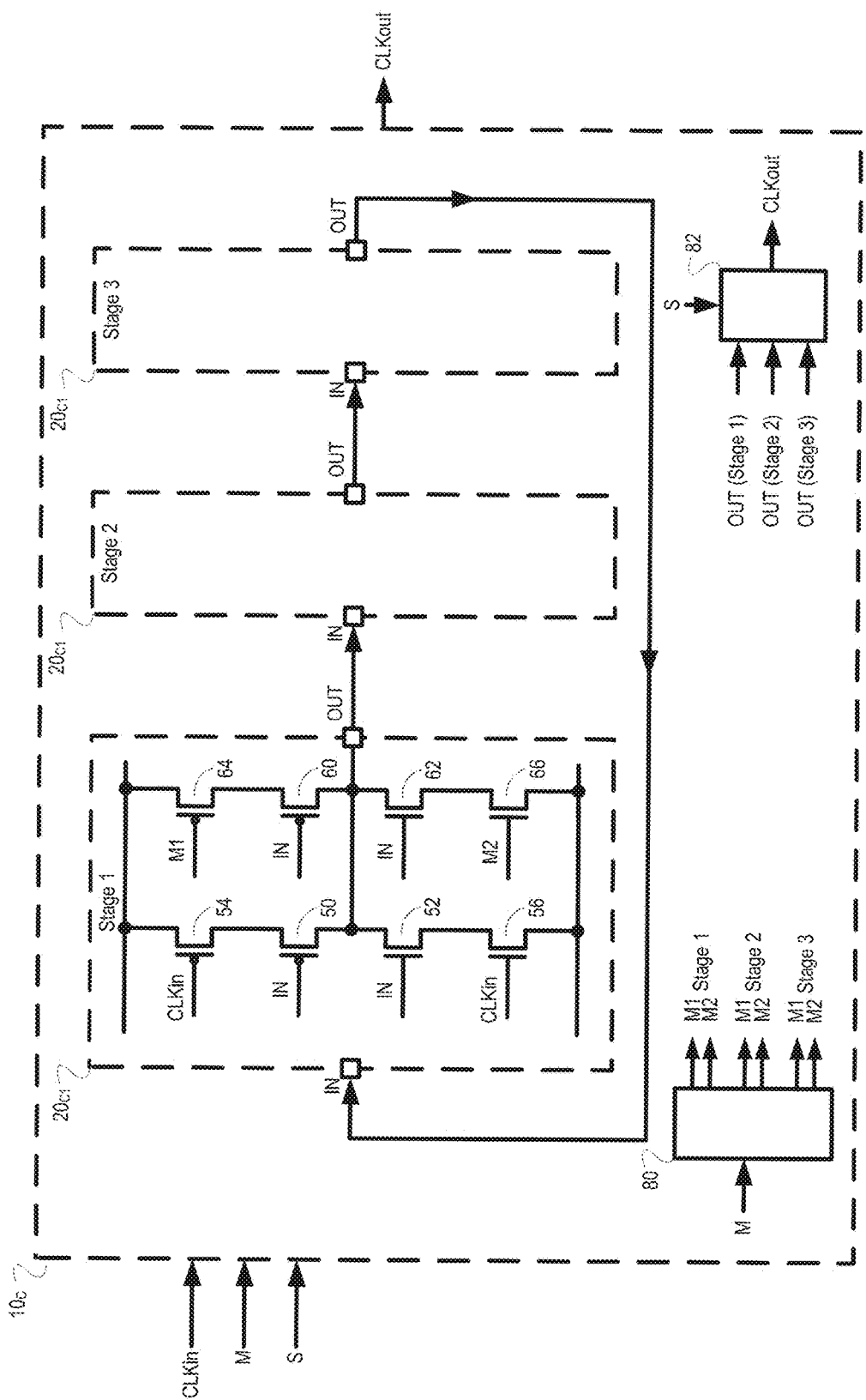
FIG. 17 is a schematic diagram representing yet a further implementation of the FIG. 1 divider circuitry, which is fully configurable.

FIG. 17 is a schematic diagram representing yet a further implementation of divider circuitry 10, here denoted $10_C$, where the number of stages N is 3 and the combination of modes is fully configurable. Clearly, other larger (odd) values of N would be possible.

For simplicity of explanation, the circuitry for each stage is shown using the example stage $20_{C1}$ of FIG. 4, although any of the other configurable stages considered herein could be used. The circuitry is shown explicitly for stage 1, and is assumed to be the same for stages 2 and 3 since this provides convenient circuitry from design and performance perspectives. Accordingly, duplicate description will be omitted.

For the avoidance of doubt, the input signal IN applied to the transistors 50, 52, 62, 66 in any one stage is the input signal IN of that stage. Further, the (mode) configuration signals M1 and M2, collectively M, for any one stage are the configuration signals for that stage, and thus may differ from the configuration signals M1 and M2 for another stage.

Divider circuitry $10_C$ is shown comprising a configuration unit, i.e. a mode select unit, 80 and an output clock selector 82.

The mode select unit 80 is connected to receive the overall mode, i.e. configuration, signal M as input to divider circuitry $10_C$ and to output, based upon that configuration signal M, the configuration signals M1 and M2 for each stage, as indicated. Therefore, for full flexibility in configuration (but making only modes A, B and C available), the overall configuration signal M may enable all possible values for the modes concerned. For full flexibility, the configuration signals M1 and M2 for each stage may need to be different from one another, and individually controllable. For less than full flexibility some simplification may be possible. For example, if one of the stages is to be kept in mode B (see FIGS. 14 to 16), then the configuration signals M1 and M2 for that stage may be pre-set (e.g. hard-wired) and not controllable as such.

The selector 82 is connected to receive the output signals OUT from each stage as indicated, since any one of them might be desired as the target signal CLKout. A selection signal S is indicated as being provided to the divider circuitry 10$_C$, for input to the selector 82 as shown. The selector is then operable to output any one or more of the output signals OUT as the target signal(s) CLKout based on the selection signal S. Thus, although one target signal CLKout is depicted in FIG. 17, a plurality of such target signals (perhaps being time-interleaved) may be output.

Although not shown in FIG. 17, the output signals OUT will normally be buffered by at least one inverter (e.g. two in series for a non-inverting buffer) such as buffers 90 in FIGS. 11b and 13b. This will be explored in more detail in FIG. 18.

Figure 18:
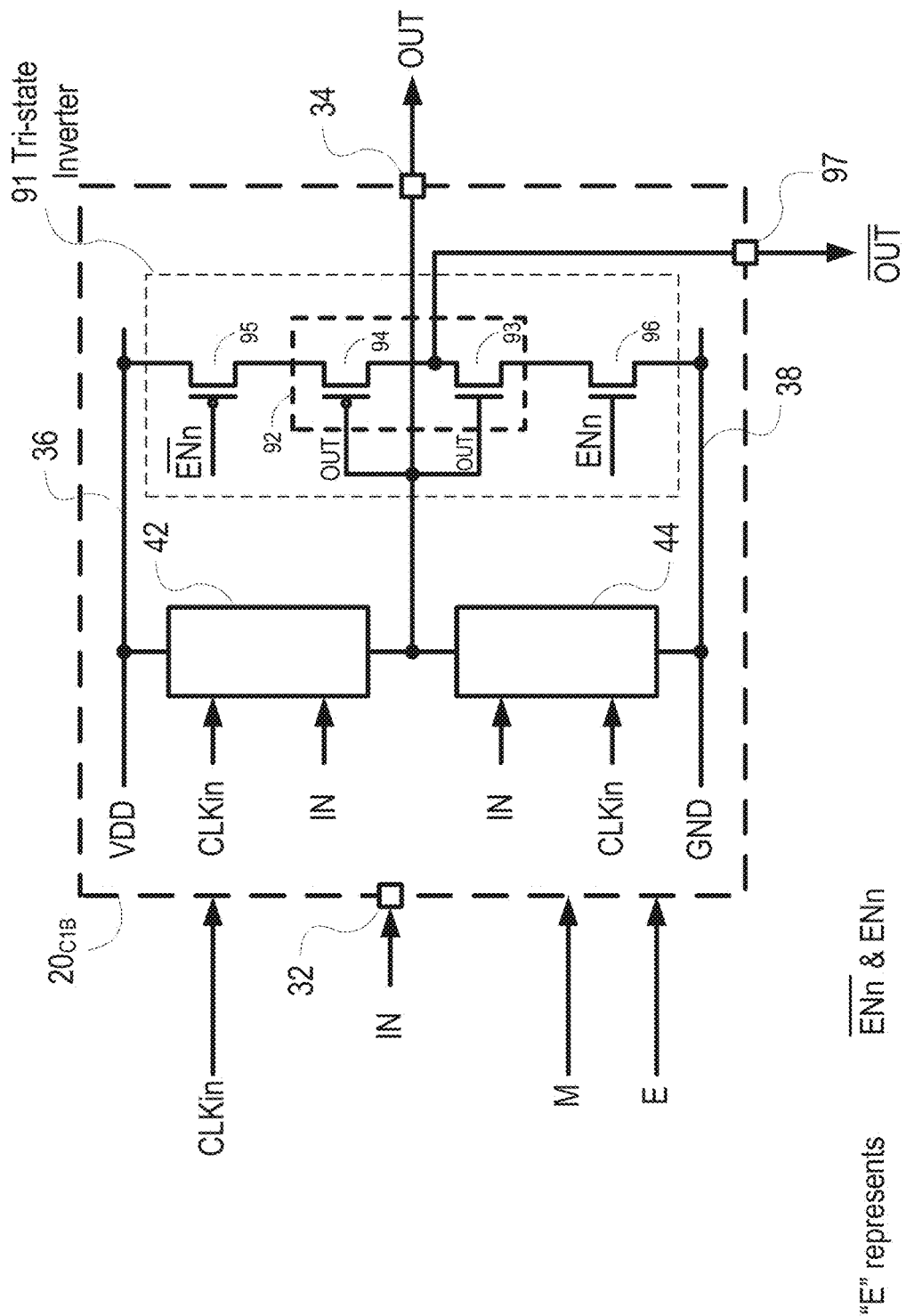
FIG. 18 is a schematic diagram of a further example configurable stage, having an inverting buffer.

FIG. 18 is a schematic diagram of a further example configurable stage 20, here denoted 20$_{C1B}$ because it is closely similar to the configurable stage 20$_{C1}$ except that an inverting buffer 91 (which can be enabled or disabled) has additionally been provided. The inverting buffer 91 is provided at the output node 34 to allow the output signal OUT to be tapped off, in a similar way (see buffer 90) as described earlier in connection with FIGS. 11b and 13b.

Various elements in configurable stage 20$_{C1B}$ correspond to elements in configurable stage 20$_{C1}$ and duplicate description will be omitted. For simplicity, the pull-up network 42 and pull-down network 44 of FIG. 4 are shown as circuit blocks in FIG. 18. In this respect, it will be appreciated that the circuitry of configurable stage 20$_{C2}$ could instead be applicable, leading to a corresponding configurable stage 20$_{C2B}$.

The inverting buffer 91 comprises a CMOS inverter arrangement 92 that comprises an NMOS transistor 93 and a PMOS transistor 94. The PMOS transistor 94 is connected to the high-side voltage VDD by a PMOS transistor 95 and the NMOS transistor 93 is connected to the low-side voltage GND by an NMOS transistor 96.

The NMOS transistor 93 and PMOS transistor 94 of the CMOS inverter arrangement 92 are controlled by the output signal OUT, and the PMOS transistor 95 and NMOS transistor 96 are controlled by an enable signal E.

The enable signal E represents the combination of ENn and /ENn, to indicate that when the enable signal is asserted (E=logic 1), the ENn signal is at logic 1 and the /ENn signal is at logic 0, so that the PMOS transistor 95 and NMOS transistor 96 are controlled to be ON. In this state (E=1), the NMOS transistor 93 and PMOS transistor 94 act as a CMOS inverter and the buffered output signal /OUT is available at the terminal 97, for example as the target output clock signal CLKout.

When the enable signal is not asserted (E=logic 0), the ENn signal is at logic 0 and the /ENn signal is at logic 1, so that the PMOS transistor 95 and NMOS transistor 96 are controlled to be OFF and both the pull-up and pull-down paths in the buffer 91 are non-conductive. In this state (E=0), the buffer 91 is effectively in the high-impedance state and disabled. As such, the buffer 91 may be described as a tri-state inverter.

Thus, it will be apparent from FIG. 18 that the buffers 90 of FIGS. 11b and 13b could be built into the individual stages 20. Stage 20$_{C1B}$ is a configurable stage, i.e. which can operate in any of modes A, B, C and I dependent on the mode configuration signal M and which can provide its output signal OUT (via inverting buffer 91 if it is enabled) for use as the target output clock signal CLKout.

Figure 19A:
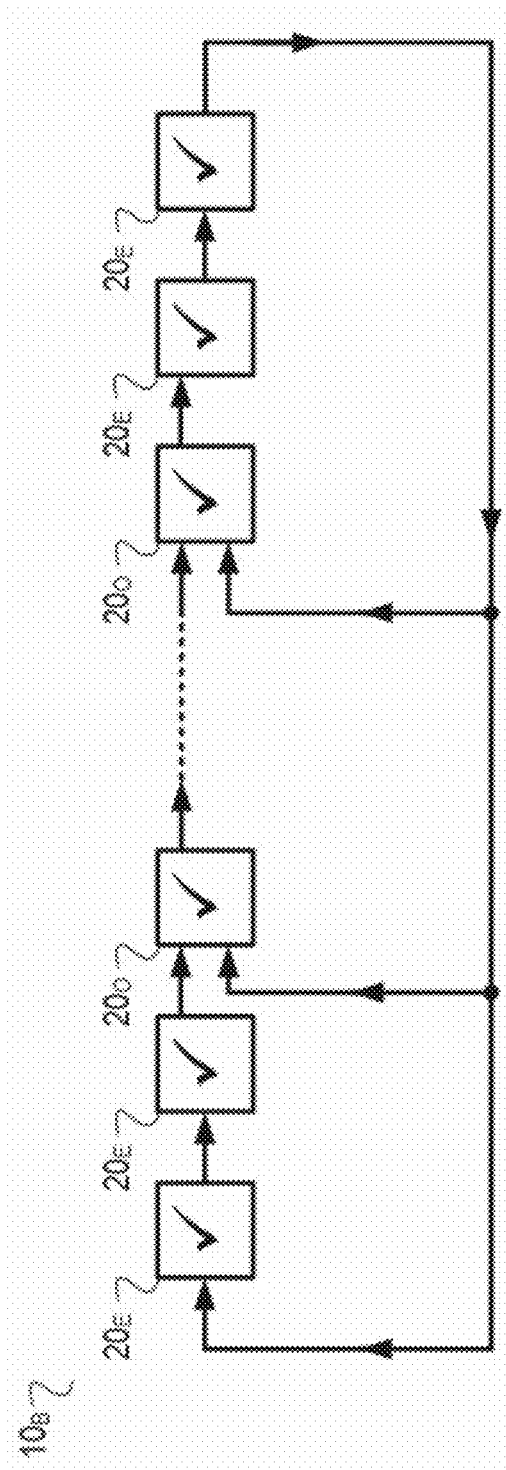
FIGS. 19a, 19b, 20a and 20b are schematic diagrams useful for understanding yet a further implementation of the FIG. 1 divider circuitry.
Figure 19B:
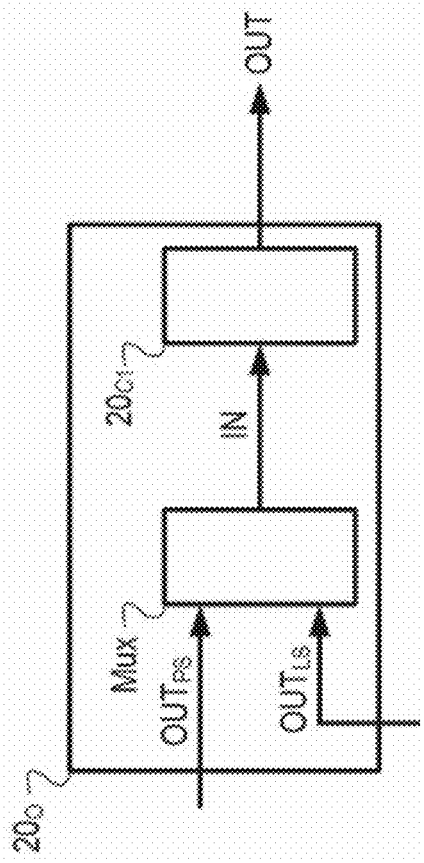
Figure 20A:
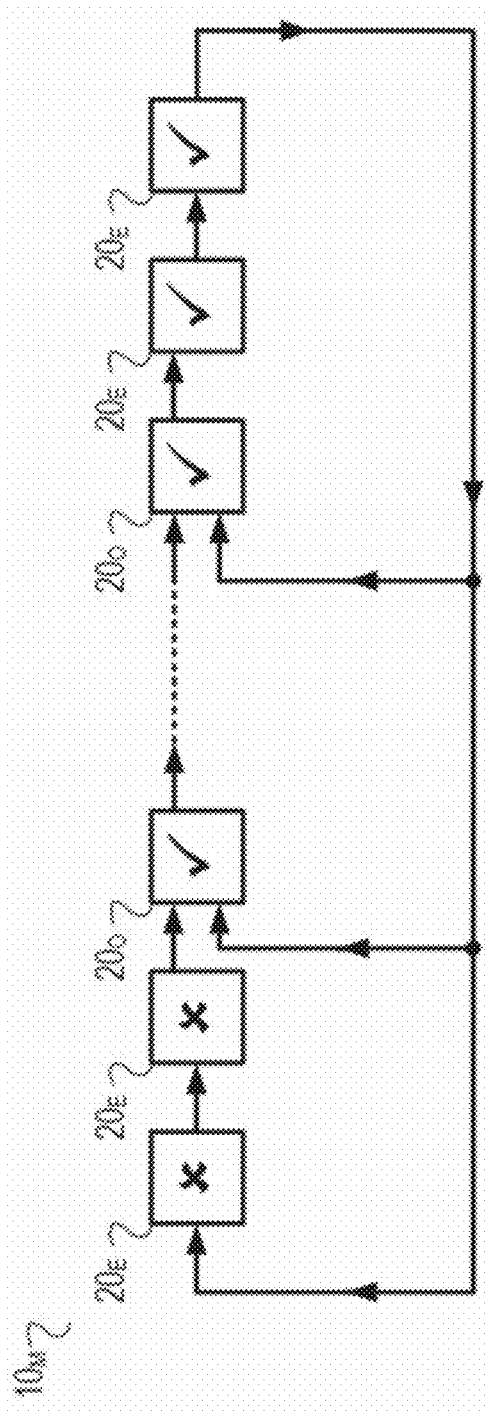
Figure 20B:
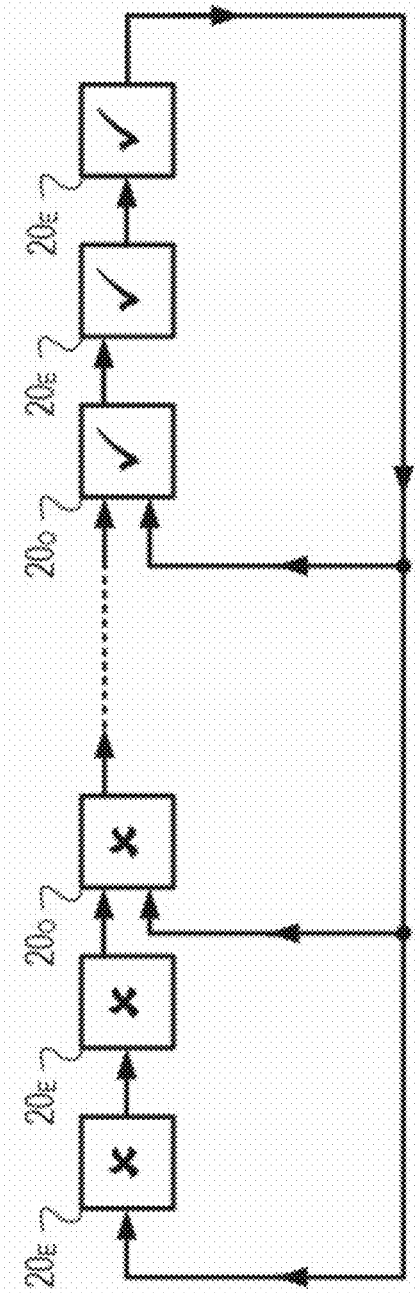

FIGS. 19a, 19b, 20a and 20b are schematic diagrams representing yet a further implementation of divider circuitry 10. The divider circuitry in FIG. 19a is denoted 10$_B$ to indicate a state when a relatively big divider ratio is desired (e.g. Di=N). The divider circuitry in FIG. 20b is denoted 10$_S$ to indicate a state when a relatively small divider ratio is desired (e.g. Di=3, where N>3), and the divider circuitry in FIG. 20a is denoted 10$_M$ to indicate a state when a divider ratio somewhere in the middle between the cases of FIGS. 19a and 20b is desired.

It will be appreciated that the general layout of stages 20 in FIGS. 19a, 20a and 20b is similar that depicted in FIG. 1, except that three different rings of stages are present. It is also assumed that N stages are present in total.

To enable the divider circuitry to selectively employ any one of the three different rings (i.e. operate in any one of the states shown in FIGS. 19a, 20a and 20b), particular stages, here denoted 20$_O$, are provided with a multiplexer (or selector) at their input side so that it is possible to select from which stage its input signal IN is taken. The other stages are denoted 20$_E$ to indicate that they may be enabled/disabled depending on whether they are needed. It will be appreciated that not all of the stages (including stages 20$_O$) need have the capability to be disabled—this will depend on the particular implementation employed.

Also, considering FIG. 19a where 7 stages (N=7) are provided, it can be appreciated that the stages 20$_O$ appear at odd positions 3 and 5 (numbering the stages from left to right). For other odd numbers of stages, the stages 20$_O$ could also appear at any or all of the odd positions part way along the chain of stages, so that each of the possible rings has an odd number of stages. For example, where N=13, the stages 20$_O$ could appear at any or all of the odd positions 3, 5, 7, 9 and 11.

An example stage 20$_O$ is shown in FIG. 19b, in which the multiplexer (or selector) may be controlled so that the input signal IN of that stage is either the output signal of the last stage (right-most stage) as depicted in FIG. 19a, here denoted OUT$_{LS}$, or the output signal of the preceding stage (adjacent to the left) as depicted in FIG. 19a, here denoted OUT$_{PS}$ Here, a stage 20$_{C1}$ is used as an example of the actual stage receiving the input signal IN and forming part of the overall stage 20$_O$.

In FIG. 19a, it is assumed that the largest of the three rings is required so that all of the stages 20 (i.e. N of the stages) are enabled (indicated by ticks), and the stages 20$_O$ each select their OUT$_{PS}$ input to be their input signal IN. With the N enabled stages it is possible to provide a relatively large divider ratio Di, for example Di=N if all of the stages operate in mode B (see the final row in FIG. 16).

It would also be possible to provide a relatively small divider ratio Di, for example Di=1, using the combination in the first row of FIG. 16 for example. However, if N is relatively large (e.g. N=15) and the desired divider ratio is relatively small (e.g. Di=1), it may be considered inefficient to use N stages. Thus, it may be possible to enable a different set of stages as in FIG. 20a or 20b.

In FIG. 20a, it is assumed that (as an example) only N−2 of the stages 20 are enabled, and that the other stages 20 are non-enabled (indicated by ticks and crosses). Note that the enabled stages are those of the middle-sized one of the three rings. In FIG. 20b, it is assumed that (as an example) only three of the stages 20 are enabled, and that the other stages 20 are non-enabled (indicated by ticks and crosses). Note that the enabled stages are those of the smallest-sized one of the three rings. With the enabled stages as in FIG. 20b as an example, it is possible to provide the desired divider ratio Di=1 (or Di=2, or Di=3), as will be understood from FIGS. 14 and 16, without needing to use the non-enabled stages.

Focus above has been placed on achieving a given integer divider ratio Di using divider circuitry 10, and various implementations of divider circuitry 10 (and its component stages 20) have been explored. Further, this divider ratio Di may be changed by configuring one or more configurable stages 20 accordingly, i.e. by changing the combination of modes in which the stages operate and/or the number of stages that are enabled. The duty cycle may be changed (in addition to or instead of changing Di) by changing one or more of: (a) from which output stage 20 the output clock signal CLKout is taken; (b) the combination of modes; and (c) the number of stages that are enabled.

This flexibility allows such changes to be made on the fly, i.e. to change the operation dynamically, and this has various applications a number of which will now be explored.

Figure 21:
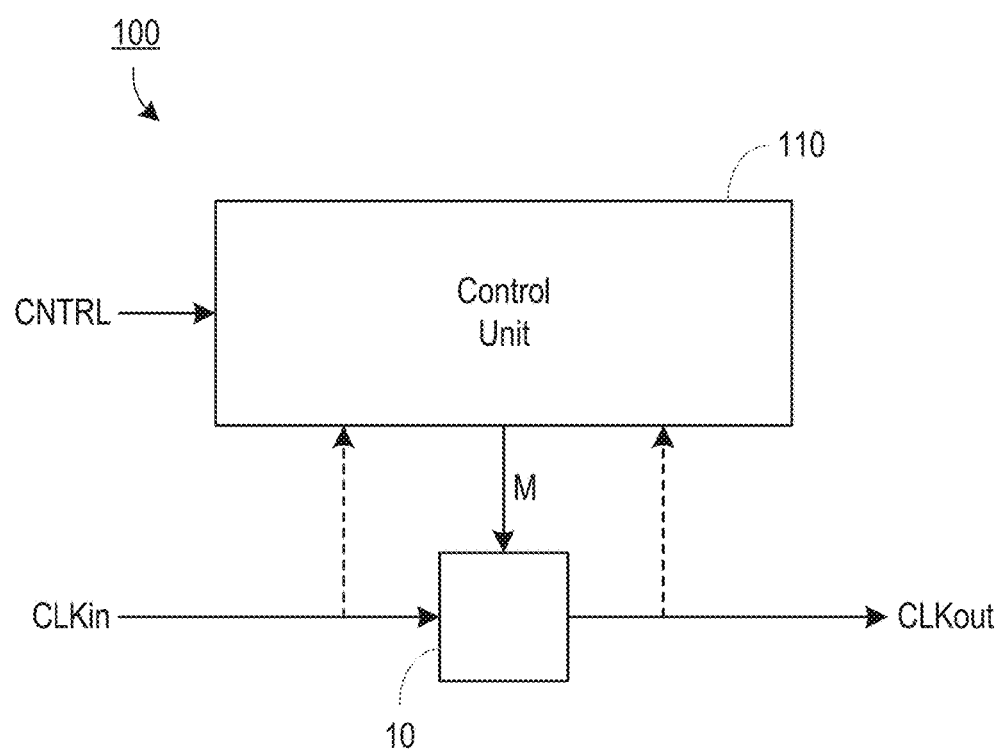
FIG. 21 is a schematic diagram of clock-control circuitry, useful for appreciating a variety of ways in which the FIG. 1 divider circuitry may be deployed.

FIG. 21 is a schematic diagram of clock-control circuitry 100, useful for appreciating a variety of ways in which divider circuitry 10 may be deployed. Clock-control circuitry 100 comprises a control unit 110 and divider circuitry 10. It will be understood that divider circuitry 10 in FIG. 21 is representative of any of the various configurable implementations described above.

As before, divider circuitry 10 is configured to generate an output clock CLKout (target signal) based on an input clock CLKin (reference signal), with there being at any one time an integer divider ratio Di between the frequencies of those clock signals.

The control unit 110 is operable to receive a control signal CNTRL, and based on CNTRL to output the (mode) configuration signal M to the divider circuitry. The configuration signal M has been described above as controlling the combination of modes in which the stages 20 (not shown) operate. However, other aspects of the operation of divider circuitry may be configured in some implementations, for instance from which output stage 20 the output clock signal CLKout is taken (see signal S in FIG. 17 and E in FIG. 18) and the number of stages 20 that are in the operational loop (see FIGS. 19a, 19b, 20a and 20b). As another example, the number of output clock signals CLKout may be configured, for example by selecting those output signals OUT that are desired. It will be understood that any of these aspects of the operation may be configured by suitable signals from the control unit 110 to the divider circuitry 10 and the configuration signal M will be considered here onwards as being representative of any or all of such signals for simplicity.

The control unit may be connected to operate based on one or both of the input clock CLKin and output clock CLKout (and thus, in general, any of the output signals OUT) so as to toggle or adjust the configuration of the divider circuitry 10 (such as the combination of modes) safely on either/any of those clocks, i.e. without disrupting the operation of the divider circuitry 10 (e.g. leading to unwanted glitches or even an unstable state). For example, the control unit 110 may be configured to control the divider ratio Di and/or the duty cycle based on (e.g. synchronised with) such clocks. The inputs of CLKin and CLKout to the control unit 110 are shown as optional as one or other of them may be dispensed with in some implementations, and even both of them may be dispensed with for example if the configuration is set e.g. on startup and not adjusted during runtime.

Figure 22:
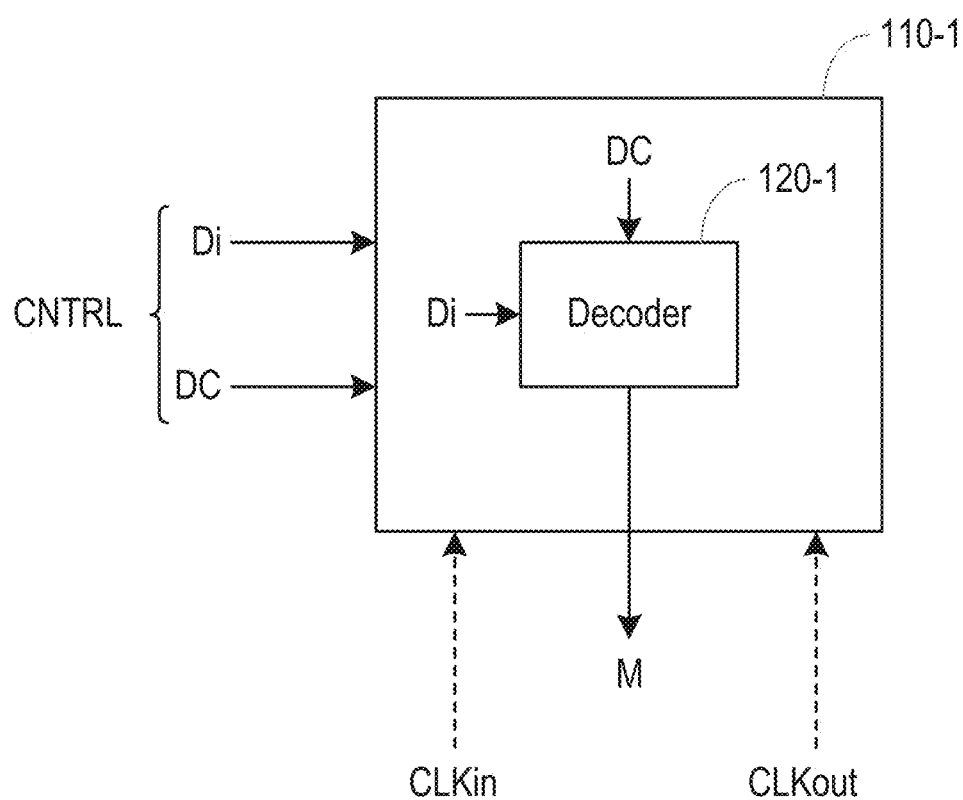
FIG. 22 is a schematic diagram of an example implementation of the control unit of FIG. 21.

FIG. 22 is a schematic diagram of an example implementation of the control unit 110, here denoted as 110-1. The control signal CNTRL is taken to comprise one or both of signals Di (indicating a desired divider ratio Di) and DC (indicating a desired duty cycle).

The control unit 110-1 comprises a decoder 120-1 operable to generate the configuration signal M based on the signals Di and/or DC. As mentioned above, where signal DC is employed the configuration signal M may be operable to control for example from which output stage 20 (not shown) the output clock signal CLKout is taken. With reference to FIGS. 11 through 20, it will be appreciated that the decoder is configured to provide a suitable configuration signal M given different values of Di and DC. Such decoder design is within the knowledge of the skilled person having the benefit of the disclosure above, and as such further details are unnecessary.

One or both of the signals Di and DC may vary over time, i.e. dynamically during operation of the clock-control circuitry 100. To allow for this, it is indicated in FIG. 22 that one or both of the input clock CLKin and output clock CLKout may be input to the control unit 110-1. As an example, the clock control circuitry may be configured to switch between two different values of Di, such as Di1 and Di2. By switching between Di1 and Di2, a fractional frequency divider may be provided where the output clock signal CLKout stabilises at a frequency which is between integer values Di1 and Di2 (i.e. at the time average of Di1 and Di2, that average having a fractional part).

By varying the percentage of time the divider circuitry 10 spends at the two divider values, the frequency of the output clock signal CLKout may be controlled with very fine granularity. A sigma-delta (or delta-sigma) modulator may for example be used to randomize the selection of Di1 and Di2, while maintaining a desired time-averaged ratio to avoid frequency issues related to periodic sequences of Di1 and Di2.

Figure 23:
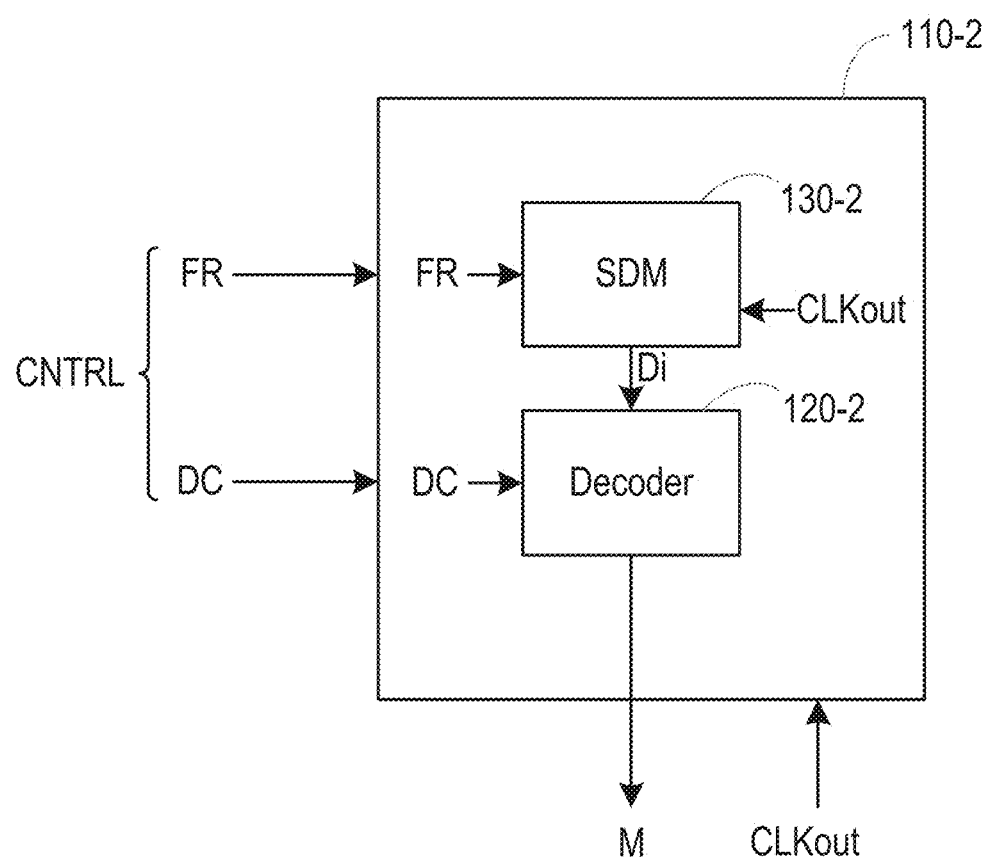
FIG. 23 is a schematic diagram of another example implementation of the control unit of FIG. 21.

FIG. 23 is a schematic diagram of another example implementation of the control unit 110, here denoted as 110-2. The control signal CNTRL here is taken to comprise one or both of signals FR (indicating a desired fractional divider ratio) and DC. Only one of the input clock CLKin and output clock CLKout, in this case CLKout, is shown as being input to the control unit 110-2, as a convenient example. The timing of the change in configuration of the divider circuitry 10 is thus controlled based on CLKout so that the configuration is changed safely.

The control unit 110-2 comprises decoder 120-2 (corresponding closely to decoder 120-1) along with a sigma-delta modulator (SDM) 130-2. The SDM 130-2 is configured to receive the signal FR and to generate based on FR an integer divider ratio signal Di whose value changes or toggles over time such that the time average value corresponds to the desired fractional divider ratio. For example, the SDM 130-2 may randomize the selection of two integer values Di1 and Di2 to avoid the frequency issues mentioned above. If for example, Di1=3 and Di2=4, then if the SDM 130-2 ensures that on average both of the values Di1 and Di2 are employed for 50% of the time, then a fractional divider ratio of 3.5 could be achieved.

The decoder 120-2 is operable to generate the configuration signal M based on the signals Di and/or DC. As mentioned above, where signal DC is employed the configuration signal M may be operable to control for example from which output stage 20 (not shown) the output clock signal CLKout is taken. Again, suitable decoder design is within the knowledge of the skilled person given the disclosure above, and as such further details are unnecessary.

Figure 24:
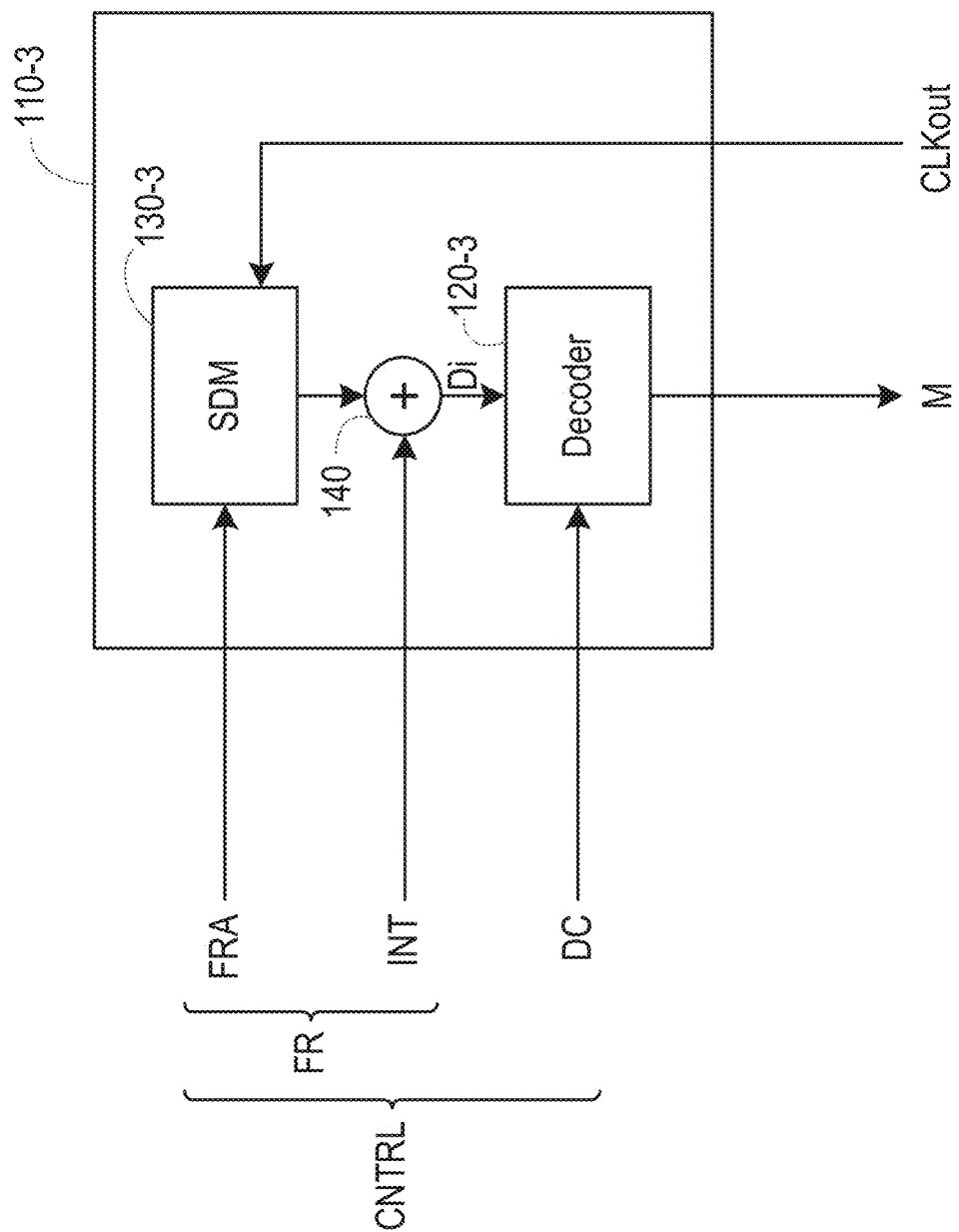
FIG. 24 is a schematic diagram of another example implementation of the control unit of FIG. 21.

FIG. 24 is a schematic diagram of another example implementation of the control unit 110, here denoted as 110-3. Here, the control signal CNTRL is taken to comprise one or both of signals FR and DC. Again, for simplicity, CLKout, is shown as being input to the control unit 110-2 as a convenient example.

The control unit 110-3 comprises decoder 120-3 (corresponding closely to decoders 120-1 and 120-2) along with a sigma-delta modulator (SDM) 130-3 (corresponding closely to SDM 130-2) and an adder 140.

In this implementation, the signal FR comprises an integer part INT and a fractional part FRA (i.e. a value between 0 and 1). For example, if the signal FR had the value 3.5, INT would have the value 3 and FRA would have the value 0.5. The SDM 130-3 is configured to receive the signal FRA and to generate based on FR an integer divider ratio signal whose value changes or toggles over time between 1 and 0 such that the time average value corresponds to the desired fractional part FRA. The SDM 130-3 randomizes the selection of integer values 1 and 0 to avoid the frequency issues mentioned above. If for example the SDM 130-3 ensures that on average both of the values 1 and 0 are employed for 50% of the time, this would correspond to a fractional part FRA of 0.5.

The adder 140 then receives the output from the SDM 130-3 and sums this with the integer part INT to generate based on FR an integer divider ratio signal Di whose value changes or toggles over time such that the time average value corresponds to the desired fractional divider ratio.

The decoder 120-3 is operable to generate the configuration signal M based on the signals Di and/or DC. As mentioned above, where signal DC is employed the configuration signal M may be operable to control for example from which output stage 20 (not shown) the output clock signal CLKout is taken. Again, suitable decoder design is within the knowledge of the skilled person.

Note that (although not shown in FIGS. 21 to 24) where the configuration signal M (e.g. output by the decoder 120) is changing synchronous to the input clock CLKin (rather than the output clock CLKout), there may be a need for the decoder 120 or control unit 110 to observe some or all the output signals OUT from the stages 20 (not shown) of the divider circuitry 10 to determine the next state for the configuration signal M.

If there is a limited range of divider ratios or duty cycle options which need to be available in a given implementation, and depending on if the decoder 120 needs to operate synchronous to the input clock CLKin or the output clock CLKout, then the decoder 120 may be optimised to toggle/adjust the least number of signal nets required (i.e. the minimum number of signals within the divider circuitry 10) to conserve power.

It will be understood that the signals Di, FR and DC discussed above are merely examples. For example, high period/low period control could be employed instead. Similarly, the control unit 110 (including its sub-components) could be optimised to an extent to just have one or a combination of these inputs.

Looking at FIG. 16 for example, the duty cycle DC options for the architectures described herein are most readily available when the divider ratio Di is set to the middle of the divider range (i.e. N/2). When the divider ratio Di is close to N or 1, the duty cycle control is limited in its accessible range. This duty cycle control would be most useful operating around a centre point of the divider ration Di being N/2, where N is larger for more duty cycle levels.

It will also be recalled (see e.g. FIG. 13b) that multiple output clock signals CLKout (e.g. CLKout1, CLKout2, etc.) may be utilized, for example enabling the production of time-interleaved clock signals (see e.g. FIG. 12).

Thus, by using combinations of the above, the clock-control circuitry 100 may be considered a low power and low area option for a fractional-N (fractional-Di) clock divider, a duty cycle controller, or both at the same time. It will be appreciated that the clock signals herein may be referred to generically as signals, and that the output clock signal CLKout need not be employed as a clock signal as such.

The clock-control circuitry 100 could thus be used as a standalone block or for example as a new or existing block in a control loop. An example use case, an FLL (also PLL and DLL) control loop will now be considered, in which the clock-control circuitry 100 is used as a low power option for the fractional divider in the feedback path.

Figure 25:
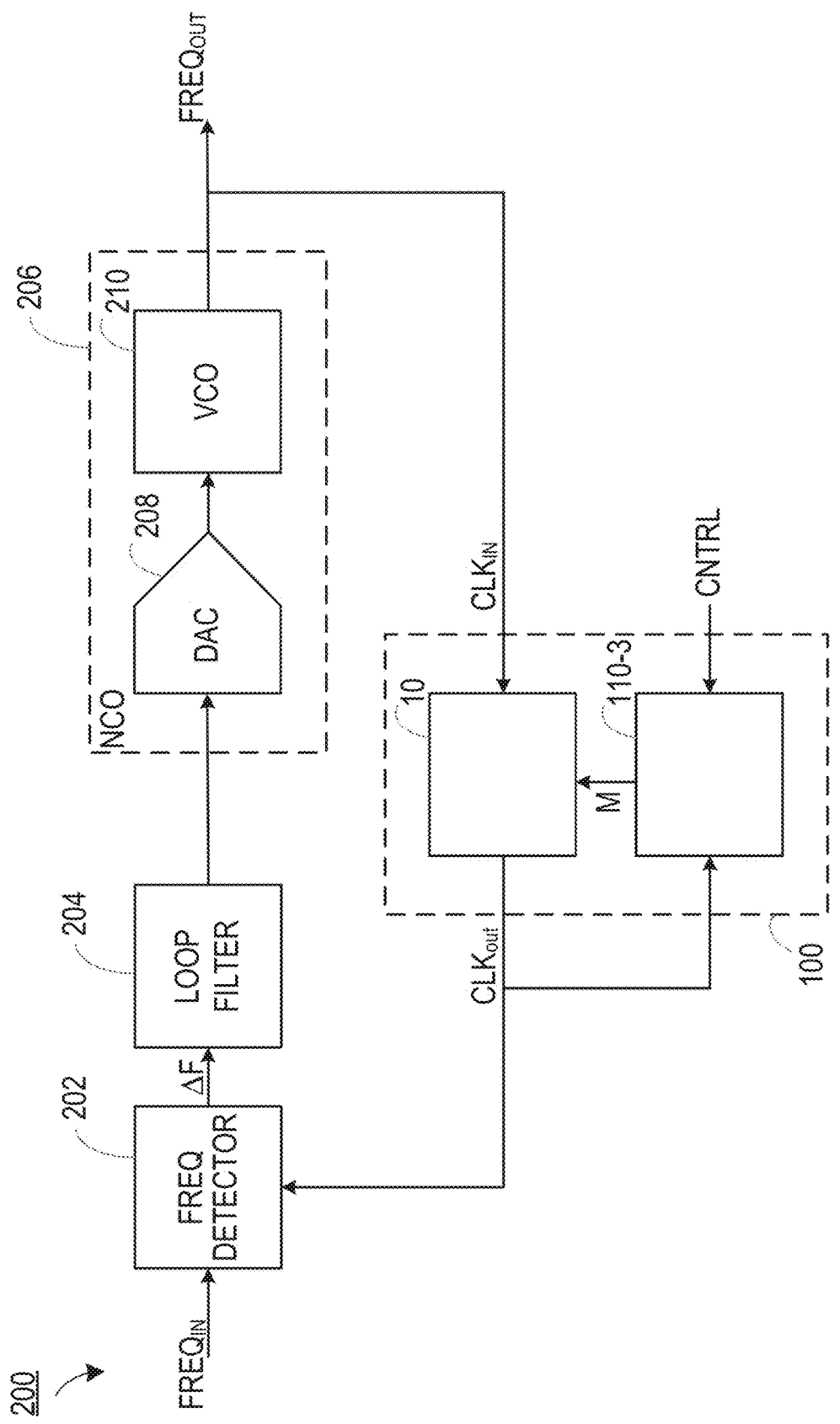
FIG. 25 is a schematic diagram of a digital FLL.

FIG. 25 is a schematic diagram of a digital FLL (frequency-lock or frequency-locked loop) 200. It is advantageous to realize as much of the FLL as possible using digital circuitry, due to the benefits that are inherent with digital signal processing (i.e. cheaper, smaller die area, rapid testability, etc.).

With reference to FIG. 24, an input signal having a frequency FREQin is applied to a frequency detector 202 which outputs a signal representing the frequency difference ΔF between the input signal and a feedback signal, in this case corresponding to the output clock signal CLKout discussed above. The value of ΔF is input to a loop filter 204 with an integrator function, which outputs the integrated signal to a numerically controlled oscillator (NCO) 206.

In this example shown, the NCO 206 is realized as the combination of a digital-to-analogue converter (DAC) and a voltage-controlled oscillator (VCO) 210, but any numerically controlled oscillator may be used.

The output of the NCO 206 is the output signal of the FLL 200, having a frequency FREQout. This output signal corresponds to the input clock signal CLKin discussed above.

Fractional division is achieved by the clock-control circuitry 100, for example configured in line with the implementation of the control unit 110-3 of FIG. 24. In this instance, the fractional part FRA might be very accurately defined, for example of the order of 20 bits. The value of the signal FR is chosen to correspond to the factor by which the input frequency FREQin is to be multiplied to get the output frequency FREQout.

The general principle of fractional division is therefore to divide by integers either side of the desired fractional number, but to weight these such that the average output is accurate.

Realistically, for a control system such as the FLL 200, the number N of stages 20 in the divider circuitry 10 would be much larger than 5 in practical and useful implementations, but N=5 is useful as a basic example. With N=5, and Di=3, the combination BBIBB may be used. With N=5, and Di=4, the combination BBABB may be used.

Thus, with the example desired fractional divider ratio of 3.5 as discussed above, using Di1=3 and Di2=4 and toggling between these values, the fractional divider ratio of 3.5 could be achieved by only needing to change one signal (control net) within the divider circuitry 10. That is, to change one of the stages 20 from mode A to mode I, only the signal M1 need be changed for that stage as is clear from FIG. 5.

This may be expanded further to use the advantages of the divider circuitry 10, e.g. divider ratios Di from 1 to N in combination with the SDM, good fractional divide functionality may be provided.

Considering duty cycle control, with N=5, Di=3, and a 50/50 duty cycle, the combination BBIBB may be used. With N=5, Di=3, and a 30/70 duty cycle, the combination BBCBA may be used. Thus, to change from a 50/50 to a 30/70 duty cycle, one of the stages 20 could be changed from mode I to mode C and another from mode B to mode A. This corresponds to just two signal (control net) changes within the divider circuitry 10. By expanding this further, good duty cycle control functionality is provided.

It will incidentally be appreciated that such duty cycle control functionality may allow the clock-control circuitry 100 to operate as a digital-to-analogue converter (DAC). For example, if a clock signal with a duty cycle such as 99/1 is output based on a digital CNTRL signal with a high digital value, this clock signal when averaged may have a high analogue (voltage) value. Similarly, if a clock signal with a duty cycle such as 1/99 is output based on a digital CNTRL signal with a low digital value, this clock signal when averaged may have a low analogue (voltage) value. It will be appreciated that values across this range could also be achieved. This corresponds to low-power DAC functionality. Indeed, it will be appreciated that the duty cycle control functionality and/or fractional divide functionality may be applicable to blocks such as block 206 in FIG. 25.

It will already be understood that divider circuitry considered herein may be implemented in a host device, for example an electrical or electronic device. Examples include a portable and/or battery powered host device such as a mobile telephone, an audio player, a video player, a PDA, a mobile computing platform such as a laptop computer or tablet and/or a games device, for example.

Figure 26:
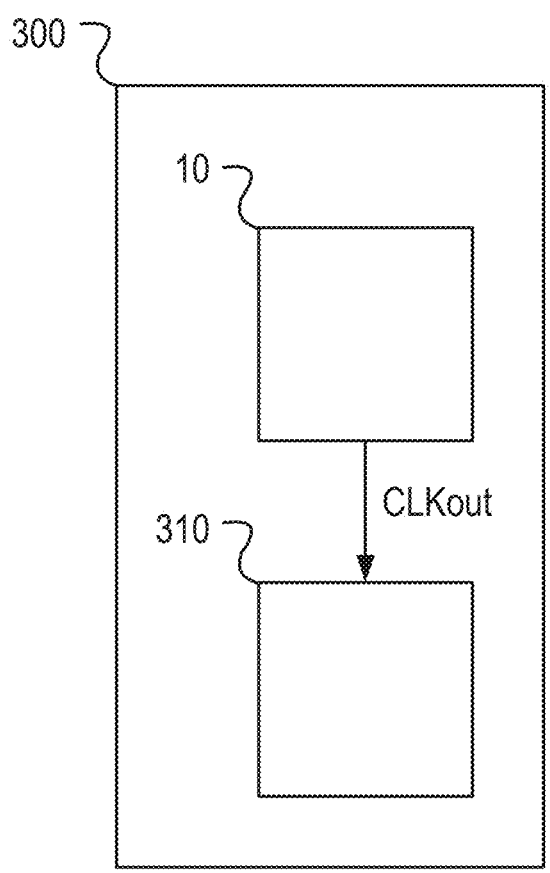
FIG. 26 is a schematic diagram of an electrical or electronic device, which comprises the divider circuitry of FIG. 1.

FIG. 26 is a schematic diagram of an electrical or electronic device 300, which may be considered such a host device.

Device 300 comprises divider circuitry 10 (or clock-control circuitry 100 having the divider circuitry 10) as considered earlier herein and target-signal-controlled circuitry 310. The divider circuitry 10 is connected to supply its target signal(s), i.e. the clock output signal(s) CLKout to the target-signal-controlled circuitry 310, so that the target-signal-controlled circuitry 310 can operate based on that target signal(s). The target-signal-controlled circuitry 310 may be any circuitry configured to operate based upon that clock signal(s).

The skilled person will understand from the present disclosure that some divider circuitry disclosed herein is configured to operate with a divider ratio Di=1. As such, the terms divide, division and similar may encompass a divider ratio Di=1.

The skilled person will recognise that some aspects of the above described apparatus (circuitry and devices) and methods may be embodied as processor control code, for example on a non-volatile carrier medium such as a disk, CD- or DVD-ROM, programmed memory such as read only memory (Firmware), or on a data carrier such as an optical or electrical signal carrier. For example, the configuration unit may be implemented as a processor operating based on processor control code.

For some applications, such aspects will be implemented on a DSP (Digital Signal Processor), ASIC (Application Specific Integrated Circuit) or FPGA (Field Programmable Gate Array). Thus the code may comprise conventional program code or microcode or, for example, code for setting up or controlling an ASIC or FPGA. The code may also comprise code for dynamically configuring re-configurable apparatus such as re-programmable logic gate arrays. Similarly, the code may comprise code for a hardware description language such as Verilog™ or VHDL. As the skilled person will appreciate, the code may be distributed between a plurality of coupled components in communication with one another. Where appropriate, such aspects may also be implemented using code running on a field-(re)programmable analogue array or similar device in order to configure analogue hardware.

Some embodiments of the present invention may be arranged as part of an audio processing circuit, for instance an audio circuit (such as a codec or the like) which may be provided in a host device as discussed above. A circuit or circuitry according to an embodiment of the present invention may be implemented as an integrated circuit (IC), for example on an IC chip. One or more input or output transducers may be connected to the integrated circuit in use.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in the claim, "a" or "an" does not exclude a plurality, and a single feature or other unit may fulfil the functions of several units recited in the claims. Any reference numerals or labels in the claims shall not be construed so as to limit their scope.

The invention claimed is:

1. Configurable frequency-divider circuitry for generating a target signal TS of a frequency Fr/Di based on a reference signal RS of a frequency Fr, where Di is an integer divider ratio, the frequency-divider circuitry comprising:

N divider stages organized into a ring, each divider stage having an input node and an output node and configured to receive an input signal IS at its input node and generate an output signal OS at its output node, with the divider stages connected together so that the output signal OS of each successive divider stage in the ring forms the input signal IS of the next divider stage in the ring, wherein:

each divider stage comprises a logic high voltage reference and a logic low voltage reference;

each said divider stage is arranged to operate in at least one of a mode A, a mode B, a mode C and a mode I;

each divider stage comprises a pull-up path which extends between its output node and its logic high voltage reference, with a transistor connected therealong and controlled by the input signal IS of that divider stage if that divider stage is arranged to operate in said mode I or said mode C, or with a transistor connected therealong and controlled by the input signal IS of that divider stage and another transistor connected therealong and controlled by the reference signal RS if that divider stage is arranged to operate in said mode A or said mode B;

each divider stage comprises a pull-down path which extends between its output node and its logic low voltage reference, with a transistor connected therealong and controlled by the input signal IS of that divider stage if that divider stage is arranged to operate in said mode I or said mode A, or with a transistor connected therealong and controlled by the input signal IS of that divider stage and another transistor connected therealong and controlled by the reference signal RS if that divider stage is arranged to operate in said mode B or said mode C;

at least one of the divider stages is a configurable divider stage and comprises said pull-up path with the transistor connected therealong and controlled by the input signal IS of that divider stage and the transistor connected therealong and controlled by the reference signal RS, a further pull-up path which extends between its output node and its logic high voltage reference with a transistor connected therealong and controlled by the input signal IS of that divider stage and another transistor connected therealong and controlled by a first mode-configuration signal M1, said pull-down path with the transistor connected therealong and controlled by the input signal IS of that divider stage and the transistor connected therealong and controlled by the reference signal RS, and a further pull-down path which extends between its output node and its logic low voltage reference with a transistor connected therealong and controlled by the input signal IS of that divider stage and another transistor connected therealong and controlled by a second mode-configuration signal M2;

for each said divider stage having a said transistor connected along a said pull-up path and controlled by the reference signal and a said transistor connected along a said pull-down path and also controlled by the reference signal, those transistors are configured to be controlled by the reference signal so that when one of those transistors is OFF the other of those transistors is ON;

the target signal TS is one of the output signals OS or a signal derived therefrom; and the configurable frequency-divider circuitry further comprises a configuration unit operable, for each configurable divider stage, to configure the voltage levels of its first and second mode-configuration signals M1 and M2 to control which of said modes that configurable divider stage operates in and therefore a combination of said modes in which the N divider stages operate, and thereby configure a value of Di.

2. The configurable frequency-divider circuitry according to claim 1, wherein each of a plurality or all or all but one of the divider stages is a said configurable stage.

3. The configurable frequency-divider circuitry according to claim 1, wherein the configuration unit is operable, for each configurable divider stage, to provide its first and second mode-configuration signals M1 and M2 so as to turn its transistors controlled by the first and second-mode configuration signals M1 and M2:

for said mode A, OFF and ON respectively;
for said mode B, OFF and OFF respectively;
for said mode C, ON and OFF respectively; and
for said mode I, ON and ON respectively.

4. The configurable frequency-divider circuitry according to claim 1, comprising a selector operable to:

receive the output signals OS from some or all of the divider stages, and to output one or more of the output signals as the target signal TS in dependence upon a selection signal; or receive the output signals OS from some or all of the divider stages via a buffer, and to output one or more of the output signals received via the buffer as the target signal TS in dependence upon a selection signal, and further comprising a control unit operable to provide the selection signal.

5. The configurable frequency-divider circuitry according to claim 4, wherein the a control unit is operable to cause the configuration unit to vary the value of Di and/or to cause the selector to vary the selection signal to change which one or more of the output signals or buffered output signals is output as the target signal TS.

6. The configurable frequency-divider circuitry according to claim 1, further comprising a control unit operable to cause the configuration unit to vary the value of Di over time so that the value of Di alternates over time between two values Di1 and Di2 and when averaged over time has a value which is a time average of Di1 and Di2 and has a fractional component.

7. The configurable frequency-divider circuitry according to claim 1, wherein the reference signal RS and the target signal TS are clock signals.

8. The configurable frequency-divider circuitry according to claim 1, wherein, for at least one or each said configurable divider stage, its said pull-up paths are separate parallel pull-up paths and its said pull-down paths are separate parallel pull-down paths.

9. The configurable frequency-divider circuitry according to claim 2, wherein:

each configurable divider stage is formed by a circuitry structure; and the circuitry structures of the configurable divider stages are the same as one another.

10. The configurable frequency-divider circuitry according to claim 1, wherein:

for each divider stage, the logic high voltage reference provides a digital 1 voltage level and the logic low voltage reference provides a digital 0 voltage level;

the reference signal RS, the input signals IS and the output signals OS are digital signals;

for each divider stage arranged to operate in said mode A, a said pull-up path of that divider stage is configured to be conductive if a Boolean expression /IS./RS evaluates to a digital 1 value and a said pull-down path of that divider stage is configured to be conductive if a Boolean expression IS evaluates to a digital 1 value;

for each divider stage arranged to operate in mode B, a said pull-up path of that divider stage is configured to be conductive if a Boolean expression /IS./RS evaluates to a digital 1 value and a said pull-down path of that divider stage is configured to be conductive if a Boolean expression IS.RS evaluates to a digital 1 value;

for each divider stage arranged to operate in mode C, a said pull-up path of that divider stage is configured to be conductive if a Boolean expression /IS evaluates to a digital 1 value and a said pull-down path of that divider stage is configured to be conductive if a Boolean expression IS.RS evaluates to a digital 1 value; and for each divider stage arranged to operate in mode I, a said pull-up path of that divider stage is configured to be conductive if a Boolean expression /IS evaluates to a digital 1 value and a said pull-down path of that divider stage is configured to be conductive if a Boolean expression IS evaluates to a digital 1 value.

11. The configurable frequency-divider circuitry according to claim 1, wherein:

for each divider stage, the logic high voltage reference provides a digital 1 voltage level and the logic low voltage reference provides a digital 0 voltage level;

the reference signal RS, the input signals IS, the output signals OS, the first mode-configuration signal M1 and the second mode-configuration signal M2 are digital signals;

for each configurable divider stage, a said pull-up path of that divider stage is configured to be conductive if a Boolean expression /IS./RS+/IS./M1 evaluates to a digital 1 value and a said pull-down path of that divider stage is configured to be conductive if a Boolean expression IS.RS+IS.M2 evaluates to a digital 1 value.

12. The configurable frequency-divider circuitry according to claim 1, wherein:

the configuration unit is operable, for each configurable divider stage, to configure the voltage levels of its first and second mode-configuration signals M1 and M2 independently of one another.

13. The configurable frequency-divider circuitry according to claim 2, wherein:

the configuration unit is operable to configure the voltage levels of the first and second mode-configuration signals M1 and M2 for one of the configurable divider stages independently of the voltage levels of the first and second mode-configuration signals M1 and M2 for another one of the configurable divider stages.

14. The configurable frequency-divider circuitry according to claim 1, wherein each said transistor connected along a said pull-up path is a PMOS transistor and each said transistor connected along a said pull-down path is an NMOS transistor.

* * * * *

UNITED STATES PATENT AND TRADEMARK OFFICE
CERTIFICATE OF CORRECTION

PATENT NO. : 10,348,275 B2
APPLICATION NO. : 16/039760
DATED : July 9, 2019
INVENTOR(S) : San Martin Molina et al.

It is certified that error appears in the above-identified patent and that said Letters Patent is hereby corrected as shown below:

In the Specification

In Column 12, Line 9, delete "20c," and insert -- $20_{C1}$ --, therefor.

In the Claims

In Column 28, Line 12, Claim 6, should read as follows:
6. The configurable frequency-divider circuitry according to claim 1, further comprising a control unit operable to cause the configuration unit to vary the value of Di over time so that the value of Di alternates over time between two values Di1 and Di2 and when averaged over time has a value which is a time average of Di1 and Di2 and has a fractional component.

Signed and Sealed this
Tenth Day of December, 2019

Andrei Iancu
*Director of the United States Patent and Trademark Office*